United States Patent
Tsunemi et al.

(10) Patent No.: US 9,276,104 B2
(45) Date of Patent: Mar. 1, 2016

(54) HIGH-FREQUENCY SEMICONDUCTOR DEVICE AND METHOD OF MANUFACTURING THE SAME

(71) Applicant: Sony Corporation, Tokyo (JP)

(72) Inventors: Hiroki Tsunemi, Kagoshima (JP); Hideo Yamagata, Kagoshima (JP); Kenji Nagai, Kagoshima (JP); Yuji Ibusuki, Kagoshima (JP)

(73) Assignee: SONY CORPORATION, Tokyo (JP)

( * ) Notice: Subject to any disclaimer, the term of this patent is extended or adjusted under 35 U.S.C. 154(b) by 48 days.

(21) Appl. No.: 14/368,728

(22) PCT Filed: Jan. 30, 2013

(86) PCT No.: PCT/JP2013/051978
§ 371 (c)(1),
(2) Date: Jun. 25, 2014

(87) PCT Pub. No.: WO2013/118618
PCT Pub. Date: Aug. 15, 2013

(65) Prior Publication Data
US 2015/0137238 A1    May 21, 2015

(30) Foreign Application Priority Data

Feb. 8, 2012    (JP) .................................. 2012-025422

(51) Int. Cl.
| | |
|---|---|
| H01L 29/78 | (2006.01) |
| H01L 27/13 | (2006.01) |
| H01L 49/02 | (2006.01) |
| H01L 23/48 | (2006.01) |
| H01L 23/522 | (2006.01) |
| H01L 27/12 | (2006.01) |
| H01L 21/768 | (2006.01) |
| H01L 23/00 | (2006.01) |
| H01L 21/84 | (2006.01) |

(52) U.S. Cl.
CPC .............. *H01L 29/78* (2013.01); *H01L 21/768* (2013.01); *H01L 21/76898* (2013.01); *H01L 21/84* (2013.01); *H01L 23/481* (2013.01); *H01L 23/522* (2013.01); *H01L 23/5223* (2013.01); *H01L 23/5227* (2013.01); *H01L 23/5228* (2013.01); *H01L 24/11* (2013.01); *H01L 27/12* (2013.01); *H01L 27/13* (2013.01); *H01L 28/10* (2013.01); *H01L 28/24* (2013.01); *H01L 28/40* (2013.01); *H01L 2924/07802* (2013.01); *H01L 2924/1305* (2013.01); *H01L 2924/1306* (2013.01); *H01L 2924/13091* (2013.01); *H01L 2924/15788* (2013.01)

(58) Field of Classification Search
None
See application file for complete search history.

(56) References Cited

FOREIGN PATENT DOCUMENTS

| | | |
|---|---|---|
| JP | 06-029376 | 2/1994 |
| JP | 07-086298 | 3/1995 |

*Primary Examiner* — Steven Loke
*Assistant Examiner* — Juanita Rhodes
(74) *Attorney, Agent, or Firm* — Michael Best & Friedrich LLP

(57) ABSTRACT

A high-frequency semiconductor device, wherein on one surface of a semiconductor substrate, a first insulating layer, an undoped epitaxial polysilicon layer in a state of column crystal, a second insulating layer, and a semiconductor layer are formed in order from a side of the one surface, and a high-frequency transistor is formed in a location of the semiconductor layer facing the undoped epitaxial polysilicon layer with the second insulating layer in between.

16 Claims, 30 Drawing Sheets

<CONSIDERATION OF APPROPRIATE RANGE OF THICKNESS>
(RESULT OF THERAMAL ANALYSIS SIMILATION)

301: Si CMOS SW Tr.
302: CMOS DECODER
303: DEVICE SUBSTRATE FORMED IN PROCESS OF EXAMPLE 1
○ : Va
● : Vb
━━ : PLATED WIRING 20

HIGH-FREQUENCY SEMICONDUCTOR DEVICE AND METHOD OF MANUFACTURING THE SAME

TECHNICAL FIELD

The present disclosed technology relates to a high-frequency semiconductor device that includes a high-frequency transistor having a so-called SOI (silicon on insulator)-type element structure and to a method of manufacturing the same.

BACKGROUND ART

High-frequency transistors have been widely used for the purpose of, for example, high-frequency signal processing such as signal transmission, signal reception, and switching received signals and the like of wireless communication apparatuses such as a mobile phone and a wireless LAN.

For such a high-frequency transistor, a small coupling capacitance (a small parasitic capacitance) with respect to a substrate is demanded in order to perform high-speed operation.

Therefore, as a high-frequency transistor, an FET (field-effect transistor) of a compound semiconductor such as GaAs with low electric power consumption capable of simply forming a complicated circuit has been often used for a long time.

However, in a compound semiconductor-based device such as a GaAs-based device, the material cost is higher than that of a silicon-based device due to the material of a substrate and difficulty in increasing a diameter of a substrate. Further, in response to request of achieving small-sized wireless communication apparatuses and system-on-chip, it is increasingly demanded to form such a device integrally with peripheral circuits formed of silicon-based devices.

For example, taking an antenna switch as an example, in the case where a high-frequency transistor for an antenna switch is formed of a compound semiconductor-based FET, it may be desirable that a CMOS decoder for RF switch control, an IPD (an integrated passive device), or the like as a peripheral circuit be formed on a different chip. In general, a high-frequency transistor for an antenna switch and a peripheral circuit are desirably built in as a module. In the case where both the high-frequency transistor for an antenna switch and the peripheral circuit are formed on chips different from each other, the manufacturing cost is increased.

Therefore, in recent years, an antenna switch device that uses an SOI (silicon on insulator) substrate allowing a CMOS decoder circuit as a silicon-based device used as a peripheral circuit to be mounted as well has been actively promoted.

Since the SOI substrate has an advantage that a parasitic capacitance is allowed to be decreased, a high-performance antenna switch device equal to the compound-based semiconductor device is achievable thereby.

However, lowered electric characteristics resulting from self-heating of the high-frequency transistor occurs.

Such self-heating occurs due to impact ionization in the vicinity of a drain end of a channel region. In particular, in the high-frequency transistor formed on the SOI substrate, a support substrate and a silicon layer are separated, for example, by silicon oxide that is a material having heat conductivity lower double digits or more than that of silicon. While heat conductivity of silicon is 144 [W/(m·k)], heat conductivity of silicon oxide is 1.1 [W/(m·k)] that is extraordinarily small.

Therefore, heat generated in the channel region is less likely to be released to a region directly under the channel. Therefore, in the SOI-type device, temperature of the device itself becomes high and electric characteristics are lowered, compared to in a bulk-type device (a device without a silicon oxide film for substrate separation between a substrate and a channel region).

With regard to an MOS transistor, a heat release structure of an SOI-type transistor such as a structure disclosed in the following Patent Literature 1 has been known. In the heat release structure, a through-hole is formed in a portion of the rear surface of the transistor of a support substrate in an SOI substrate, and a heat conductive layer made of metal is formed from the rear surface of the support substrate to the internal wall surface and the internal bottom surface of the through-hole.

With regard to a bipolar transistor, a semiconductor device having another heat release structure of an SOI-type transistor such as a structure disclosed in the following Patent Literature 2 has been known.

In the semiconductor device, on a support substrate (a first semiconductor layer) on which a substrate separation insulating layer (a first insulating layer) is formed, a second semiconductor layer (an N-type semiconductor layer, specifically, an N-type silicon layer 3 and a second oxide film 4 are formed from the substrate separation insulating layer side. Further, on the second oxide film 4, a third semiconductor layer (an N-type epitaxial layer 5) having a separation structure of an SOI-type substrate on which a device is formed is formed.

In the N-type epitaxial layer 5, an element separation insulating film is formed around a region where a transistor is formed. In the element separation insulating film, a groove that penetrates in a thickness direction to reach the N-type silicon layer 3 is formed. Undoped multicrystal silicon films 7a and 7b are buried into the groove, and thereby, a heat release-use trench 14 is formed.

With regard to improvement of high-frequency distortion characteristics, for example, a structure disclosed in the following Non-Patent Literature 1 has been known.

In the disclosed technology, with respect to an SOI substrate on which a high-frequency switch element is formed, a trench penetrating to a semiconductor substrate 101 is formed in the periphery of the foregoing element. For example, by injecting argon by an ion implantation technology, a damage layer is formed on the semiconductor substrate 101.

By allowing the damage layer to trap a carrier generated in the semiconductor substrate at the time of applying high frequency, a change in a capacity of the substrate is prevented. Further, by fixing an electric potential of the substrate at an electrode penetrating through the semiconductor substrate shown in the trench, effects of preventing the change in the capacity of the substrate is enhanced.

With regard to improvement of high-frequency distortion characteristics, a technology using a polysilicon layer as described in the following Non-Patent Literature 2 has been known.

In the technology, an SOI substrate in which a polysilicon layer is provided on a semiconductor substrate is used.

Therefore, the technology has effects of allowing undoped polysilicon to trap a carrier generated in the semiconductor substrate at the time of applying high frequency.

CITATION LIST

Patent Literatures

Patent Literature 1: Japanese Patent No. 3173147
Patent Literature 2: Japanese Patent No. 2500630

Non-Patent Literatures

Non-Patent Literature 1: A. Botula, et. al, "A Thin-flm SOI 180 nm CMOS RF Switch Technology," Silicon Monolithic Integrated Circuits in RF Systems, 2009.

Non-Patent Literature 2: Daniel. C. Kerr, "Identification of RF harmonic distortion on Si substrates and its reduction using a trap-rich layer," Silicon Monolithic Integrated Circuits in RF Systems, 2008.

SUMMARY OF INVENTION

In the technology described in the foregoing Patent Literature 1, a transistor close to the heat conductive layer made of a metal on the bottom surface of the through-hole and a transistor far from the bottom surface are mixed. According to a distance between the through-hole and each transistor, heat release characteristics vary among the transistors.

Further, in the case where heat release characteristics are set uniform, a through-hole may be desirably provided for each transistor. In this case, it is difficult to arrange transistors densely, and lowered substrate strength is inevitable.

In the heat release structure described in the foregoing Patent Literature 2, since a heat release path is formed by the N-type silicon layer and the undoped multicrystal silicon film, effects of improving heat release are obtained.

However, in the case where the device having the heat release structure is applied to high-frequency application, since the support substrate is in a floating state, carrier change occurs at the time of applying high frequency, which causes a change in a capacity of the substrate, resulting in lowered high-frequency distortion characteristics.

In the structure described in the foregoing Non-Patent Literature 1, a section where a carrier generated in the semiconductor substrate at the time of applying high frequency is trapped is not located directly below a transistor. Therefore, it is difficult to completely suppress carrier change.

In general, as a support substrate of an SOI substrate used for a high-frequency switch, a significantly high resistance substrate is used. Therefore, it is less likely to obtain effects of fixing a substrate electric potential.

In forming the damage layer by ion implantation, ability of carrier trap is changed according to heat history, resulting in a further increase in the number of processes to increase manufacturing cost.

In the structure described in the foregoing Non-Patent Literature 2, many grain boundaries of polysilicon clusters exist. Therefore, a disadvantage that transistor characteristics are lowered by film stress is not yet overcome.

Therefore, it is desirable to provide a high-frequency semiconductor device having a device structure that prevents thermal destruction by self-heating of a high-frequency transistor formed on an SOI substrate and that has favorable harmonic distortion characteristics, and a method of manufacturing a high-frequency semiconductor device to achieve the foregoing device structure.

A high-frequency semiconductor device of an embodiment of the present disclosed technology includes: a first insulating layer; an undoped epitaxial polysilicon layer in a state of column crystal; a second insulating layer; a semiconductor layer; and a high-frequency transistor, wherein the first insulating layer, the undoped epitaxial polysilicon layer, the second insulating layer, and the semiconductor layer are formed on one surface of a semiconductor substrate in order from the one surface, and the high-frequency transistor is formed in a location of the semiconductor layer facing the undoped epitaxial polysilicon layer with the second insulating layer in between.

According to the foregoing configuration, the high-frequency transistor is formed in the location facing the undoped epitaxial polysilicon layer in a state of column crystal. The undoped epitaxial polysilicon layer becomes in a state of column crystal at the time of epitaxial growth. Therefore, even if the undoped epitaxial polysilicon layer is comparatively thick, film stress is small, and thereby, high-frequency characteristics of the high-frequency transistor are not lowered. Further, the undoped epitaxial polysilicon layer is an undoped layer. Therefore, when a high-frequency signal is applied to the high-frequency transistor, a carrier is induced in the polysilicon layer. As a result, change in a substrate capacity is suppressed, and high-frequency distortion characteristics are not lowered.

A method of manufacturing a high-frequency semiconductor device of an embodiment of the present disclosed technology includes: laminating a first insulating layer, a doped epitaxial polysilicon layer having resistance lowered by doping with an impurity, an undoped epitaxial polysilicon layer in a state of column crystal, a second insulating layer, and a semiconductor layer in this order on a semiconductor substrate; forming a high-frequency transistor including a channel region in the semiconductor layer; forming an electrode layer in a multilayer wiring layer of the semiconductor substrate, the electrode layer being connected to the high-frequency transistor with a contact plug in between; and forming a connection structure that connects the doped epitaxial polysilicon layer to a ground electric potential.

In the manufacturing method, the undoped epitaxial polysilicon layer in the state of column crystal is formed. Therefore, as in the high-frequency semiconductor device according to the above-described present disclosed technology, lowering of high-frequency characteristics, in particular, high-frequency distortion characteristics are suppressed.

Further, the doped epitaxial polysilicon layer is formed on the semiconductor substrate side of the doped epitaxial polysilicon layer, and an electric potential thereof is fixed by a connection structure. Therefore, high-frequency characteristics are further improved.

Further, the doped epitaxial polysilicon layer contributing to improving the high-frequency characteristics and the undoped epitaxial polysilicon layer are formed at the time of fabricating a so-called SOI substrate, and subsequently the connection structure is formed for connection to the ground electric potential. Therefore, a configuration for improving characteristics is allowed to be easily formed. Further, effects of improving the characteristics are not changed by heat history and/or the like.

According to the embodiments of the present disclosed technology, a high-frequency semiconductor device having a device structure that prevents thermal destruction by self-heating of a high-frequency transistor formed on an SOI substrate and that has favorable harmonic distortion characteristics, and a method of manufacturing a high-frequency semiconductor device to achieve the foregoing device structure are allowed to be provided.

MODE FOR CARRYING OUT THE INVENTION

DESCRIPTION OF EMBODIMENTS

Embodiments of the present disclosed technology will be described with reference to the drawings. The description will be given in the following order.
1. First Embodiment: an embodiment to disclose a structure of an SOI epitaxial layer, a heat release via hole structure, a ground connection structure, and methods of manufacturing these structures.
2. Second Embodiment: an embodiment to disclose a dummy wiring section.
3. Third Embodiment: an embodiment in which passive elements are provided on a support substrate side.
4. Fourth Embodiment: an embodiment in which a die attachment sheet is provided instead of the support substrate.
5. Fifth Embodiment: an embodiment to demonstrate that a semiconductor substrate itself may be omitted since the support substrate exists in the foregoing first embodiment to the foregoing fourth embodiment.
6. Consideration of appropriate ranges of thicknesses of a doped epitaxial polysilicon layer and a second insulating layer is described.
7. An application example is described.

1. First Embodiment

Figure 1:
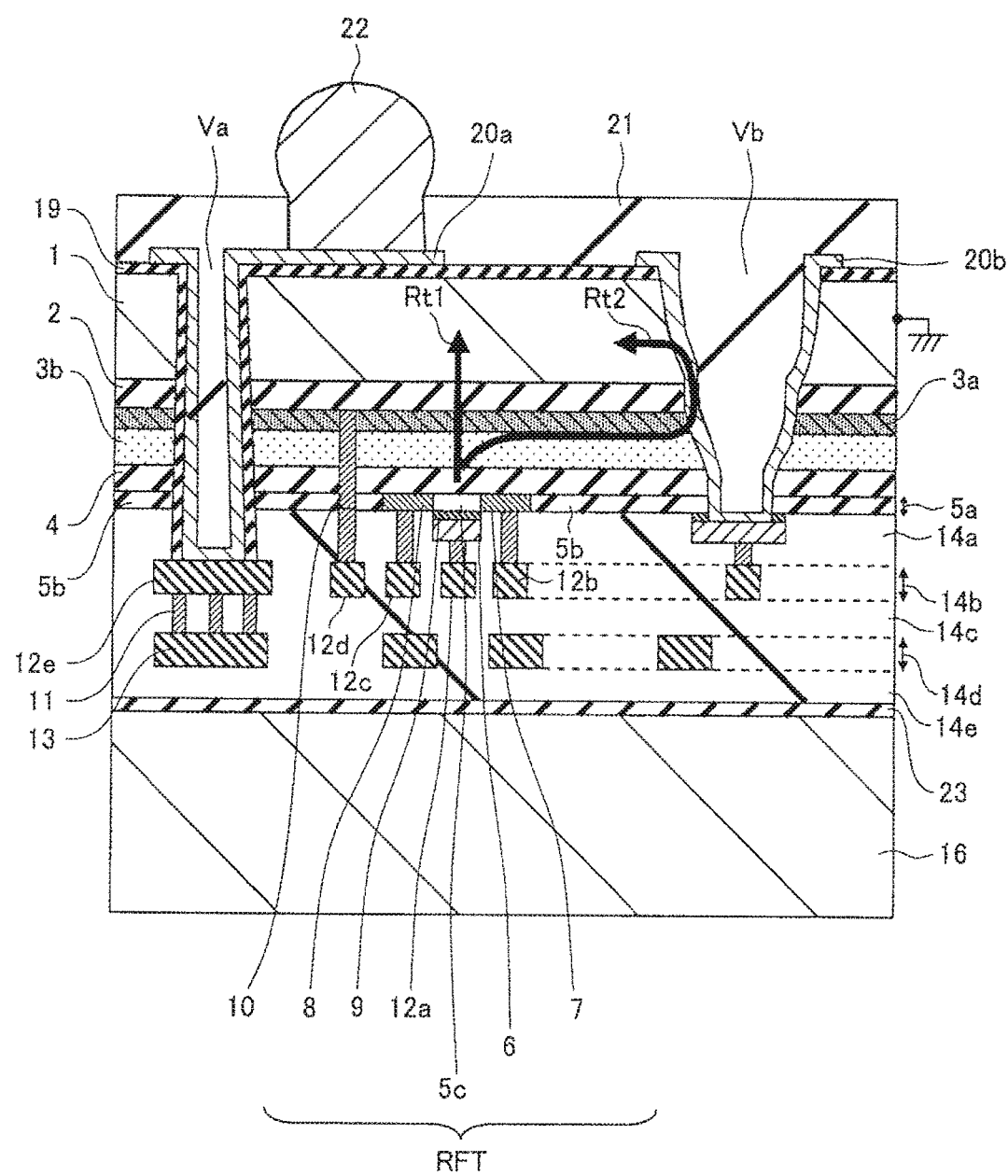
FIG. 1 is a schematic cross-sectional view of a main section of a high-frequency semiconductor device according to a first embodiment.

FIG. 1 illustrates a schematic cross-sectional view of a main section of a high-frequency semiconductor device according to a first embodiment of the present disclosed technology.

A high-frequency semiconductor device RFD1 illustrated in FIG. 1 has a basic substrate structure in which a semiconductor substrate 1 is bonded to a support substrate 16 with an adhesive 23.

Various layers and various films are formed on a surface (a first surface) on the support substrate 16 side of the semiconductor substrate 1. Out thereof, a high-frequency transistor RFT is formed in a region centering on a semiconductor layer 5a.

First, description will be given in more detail of layers laminated on the first surface (the bottom surface in FIG. 1) of the semiconductor substrate 1 and the device (the high-frequency transistor).

[1.1 Structure of Epitaxial Growth Layer]

From the first surface (the bottom surface) side of the semiconductor substrate 1, a first insulating layer 2, a doped epitaxial polysilicon layer 3a, an undoped epitaxial polysilicon layer 3b in a state of column crystal, and a second insulating layer 4 are formed in order.

For the semiconductor substrate 1, a high-resistivity silicon wafer having resistivity, for example, of 500 to 2000 Ωcm both inclusive may be suitably used. However, the resistivity of the silicon wafer is not limited thereto.

For the first insulating layer 2, a silicon oxide film may be preferably used, and the thickness thereof may be desirably from 0.1 to 0.5 μm both inclusive. It is to be noted that the first insulating layer 2 may be formed of an insulating material having lower dielectric constant than that of the silicon oxide film.

The "epitaxial polysilicon layer in a state of column crystal" may refer to a polysilicon layer formed by applying an epitaxial growth technology at temperature, for example, equal to or higher than 1000 deg C. In forming the "undoped epitaxial polysilicon layer in a state of column crystal," such a layer may be desirably formed at temperature equal to or higher than 1000 deg C.

In the case where a polysilicon layer is formed by a method other than the foregoing method, for example, is formed at temperature from 600 to 650 deg C., many cluster grain boundaries exist, and the film stress is large. Therefore, in the case where polysilicon is deposited comparatively thick (being equal to or larger than tens of micrometers), the film stress is large. As a result, it is concerned that stress may be added to a channel formation region of the device through the thin first insulating layer 2, resulting in lowered device characteristics.

The present disclosed technology is characterized in that a film directly above (a film directly below at the time of formation) the second insulating layer 4 is formed of the "undoped epitaxial polysilicon layer in a state of column crystal" in terms of preventing such lowered characteristics resulting from the film stress (a first requirement). One reason why the epitaxial polysilicon layer is "undoped" is as follows. In this case, when a high-frequency signal is applied to a gate, a drain, and/or the like of the high-frequency transistor RFT, a carrier resulting from change of high-frequency signals is induced to decrease change in a substrate capacity and to prevent lowered distortion characteristics of high-frequency output.

In the case where the first requirement is satisfied, there is a certain amount of effects on preventing lowered characteristics according to the present disclosed technology. Therefore, an "epitaxial growth layer" indicated by the referential symbols (3a and 3b) may not be configured of a two-layer structure as described above.

However, in the case where a layer between the first insulting layer 2 and the second insulating layer 4 is configured of a single layer film formed of only the undoped epitaxial polysilicon layer 3b, it may be desirable that the single layer film be greatly thickened in order to decrease the substrate capacity. Therefore, it is concerned that the film stress is increased to some degree, even if the epitaxial polysilicon layer 3b is "undoped." Further, in the case where the undoped epitaxial layer is thinned in view of the film stress, the substrate capacity is increased. Further, as described later, it may be desirable that a low-resistance layer suitable for effectively connecting the undoped layer to a ground potential be provided.

Therefore, the two-layer structure including the undoped epitaxial polysilicon layer 3b in a state of column crystal and the doped epitaxial polysilicon layer 3a may be desirable (a second requirement).

The undoped epitaxial polysilicon layer 3b in a state of column crystal may be desirably located on the side close to the device in order to improve high-frequency distortion characteristics by inducing a carrier resulting from change of high-frequency signals. Logically, the doped epitaxial polysilicon layer 3a is located on the side far from the device (the side close to the semiconductor substrate 1).

The "doped" refers to "doped with an impurity," and electrical conductivity type of the impurity may be N type or P type. Further, as an impurity doping method, in view of continuous performance of epitaxial growth, a method in which an impurity is introduced during growth in the first stage of the epitaxial growth, and such introduction of the impurity is stopped in the middle of the growth to form the undoped layer may be desirable. The doped epitaxial polysilicon layer 3a may be also desirably formed at, for example, equal to or higher than 1000 deg C. to obtain a state of column crystal.

For desirable thicknesses of the doped epitaxial polysilicon layer 3a and the undoped epitaxial polysilicon layer 3b and a kind and a desirable concentration of an introduced impurity, description will be given later.

Even if the second insulating layer 4 is thin, such thinness does not largely change the substrate capacity, in the case where an electric potential of the undoped epitaxial polysilicon layer 3b is fixed as descried later. In view of improvement of heat release characteristics, the second insulating layer 4 may be desirably thin as described later. Further, since the second insulating layer 4 is a film located between silicon single crystal (the semiconductor substrate 1) and a polysilicon layer, a thin silicon oxide film or the like may be suitably used for the second insulating layer 4 in view of not giving film stress as well.

As seen in the foregoing description, the first requirement (existence of the undoped epitaxial polysilicon layer 3b in a state of column crystal) may be a greatly desirable requirement, and the second requirement (addition of the doped epitaxial polysilicon layer 3a) is an additional requirement although it may be an abundantly desirable requirement.

Next, description will be given of a transistor structure, a heat release structure (a third requirement), and a ground connection structure (a fourth requirement). It is to be noted that the third requirement and the fourth requirement may be added to the foregoing first requirement singly or in combination with each other, or may be added to the foregoing first requirement and the foregoing second requirement singly or in combination with each other.

[1.2. Transistor Structure]

The semiconductor layer 5a is located under the second insulating layer 4. As described later, the semiconductor layer 5a may be formed, for example, by thinning a new semiconductor substrate.

In the semiconductor layer 5a, an element separation (insulating) layer 5b exists in regions (regions occupying a substantial area of the semiconductor layer 5a in FIG. 1) other than a region where the high-frequency transistor RFT is formed.

In the regions of the semiconductor layer 5a other than the element separation layer 5b, two source-drain regions (S/D) 7 and 8 are formed distantly from each other. A region between the source-drain regions 7 and 8 is a channel formation region 5c of the high-frequency transistor RFT. In the case where the channel electrical conductive type of the high-frequency transistor RFT is N type, an N-type impurity is introduced in high concentration to the source-drain regions 7 and 8, and a p-type impurity is introduced to the channel formation region 5c.

Under (above at the time of formation) the channel formation region 5c, a gate insulating film 9 made of a thin silicon oxide film or the like and a gate electrode 6 are laminated.

The gate electrode 6 is connected to a gate wiring layer 12a in a first wiring layer 14b through a contact in a first interlayer insulating film 14a. The source-drain region 7 is connected to a source-drain electrode 12b in the first wiring layer 14b. Similarly, the source-drain region 8 is connected to a source-drain electrode 12c in the first wiring layer 14b.

It is to be noted that, in the example illustrated in FIG. 1, under (above at the time of formation) the first wiring layer 14b, a second interlayer insulating film 14c, a second wiring layer 14d, and a third interlayer insulating film 14e are laminated in this order. However, the present disclosed technology is not limited to such a configuration.

Further, FIG. 1 illustrates only one terminal connection structure provided to input and output signals or to input an applied voltage. In the whole high-frequency semiconductor device, a plurality of terminal connection structures as above are provided (see FIG. 30a and FIG. 30b described later).

The terminal connection structure illustrated in FIG. 1 may have an internal wiring section in which, for example, a wiring layer 12e in the first wiring layer 14b and a wiring layer 13 in the second wiring layer 14d are connected by contact plugs 11.

A connection via hole Va is formed from the rear surface (the top surface in FIG. 1) of the semiconductor substrate 1 to reach the wiring layer 12e. An electrically-conductive connection film 20a is formed from the internal bottom surface of the connection via hole Va through the internal wall surface of the connection via hole Va to reach the rear surface (the top surface in FIG. 1) of the semiconductor substrate 1. On a portion of the connection film 20a on the rear surface of the semiconductor substrate 1, an outer connection terminal (a BGA terminal 22 here) is formed. Therefore, the BGA terminal 22 is connected to the internal wiring section with the connection film 20a in between.

It is to be noted that the internal wiring section is connected to the high-frequency transistor RFT directly or through other element.

The circumference of the BGA terminal 22 and the inside of the connection via hole Va may be covered with an insulating protective film such as a resin 21.

In contrast, the support substrate 16 is bonded to the opposite side of the side provided with the BGA terminal 22, that is, to the bottom surface of the third interlayer insulating film 14e with the adhesive 23.

The support substrate 16 may be desirably a substrate made of glass or the like in view of strength and material cost. Alternatively, in terms of assisting heat release even if only slightly, the support substrate 16 may be desirably a substrate made of a material having higher heat conductivity such as alumina ceramics and aluminum nitride.

The high-frequency semiconductor device RFD1 with the main section illustrated in FIG. 1 has at least one high-frequency transistor RFT that is illustrated. However, the reason why the semiconductor layer 5a is made of silicon is to facilitate formation integrally with other circuit (a peripheral circuit) as in an antenna switch of an after-described application example. In general, elements other than the high-frequency transistor are included in the high-frequency semiconductor device RFD1.

The high-frequency transistor RFT is formed in a location facing the undoped epitaxial polysilicon layer 3b in a state of column crystal with the second insulating layer 4 in between. The words "formed in a location facing the undoped epitaxial polysilicon layer 3b" refer to a state in which at least the undoped epitaxial polysilicon layer 3b is located directly above or directly under (directly above in the case of FIG. 1) the channel formation region 5c of the high-frequency transistor RFT.

[1.3 Heat Release Structure]

The high-frequency semiconductor device RFD1 illustrated in FIG. 1 has at least one more via hole (a heat release via hole Vb) having other shape, in addition to the connection via hole Va. More specifically, the internal wall surface of the heat release via hole Vb is formed in a forward tapered shape. In contrast, the internal wall surface of the foregoing connection via hole Va is formed in a reverse tapered shape. The reason why such a difference between two via hole shapes exists is as follows. An insulating film 19 is left on the internal wall surface of the via hole Va so that the connection film 20a and the doped epitaxial polysilicon layer 3a and/or the like are not electrically short-circuited on the internal wall surface of the via hole Va on the connection via hole Va side, and the insulating film 19 is not left on the internal wall surface of the heat release via hole Vb.

On the internal bottom surface and the internal wall surface of the heat release via hole Vb, a thermal bonding film 20b as a "thermal bonding member" is formed. Therefore, the doped epitaxial polysilicon layer 3a and the undoped epitaxial polysilicon layer 3b are thermally bonded to the semiconductor substrate 1 through the thermal bonding film 20b. A heat release path through such heat bonding is indicated by a reference symbol "Rt2" in FIG. 1.

It is to be noted that, in addition to the foregoing heat release path, as a main heat release path, a path indicated by a reference symbol "R1t" in which heat passes through the first insulating layer 2 close to the high-frequency transistor RFT as a heat generation source to the semiconductor substrate 1 also exists. Although depending on the thickness of the first insulating layer 2, heat release effect through the heat release path Rt1 is often higher in terms of its closeness to the heat source.

As other paths, a heat release path in which heat passes from the insulating film 19, the connecting film 20a, and the BGA terminal 22 to the outside and a heat release path in which heat is dissipated in a multilayer wiring layer, and subsequently passes to the support substrate 16 exist. However, heat release effects thereof are not high compared to those of the two heat release paths illustrated in FIG. 1.

Therefore, the heat release via hole Vb that effectively conducts heat to the semiconductor substrate 1 through the thermal bonding film 20b made of a material having high heat conductivity is effective for preventing lowered high frequency characteristics resulting from heat. The heat conductivity of the thermal bonding member (the thermal bonding film 20b) is higher than the heat conductivity of the first insulating layer 2. Thereby, a portion of heat not capable of being conducted through the heat release path Rt1 in FIG. 1 is allowed to be detoured to the heat release path Rt2.

It is to be noted that, as illustrated in FIG. 1, it is effective to extend the heat release path from the thermal bonding film 20b in the internal bottom section of the heat release via hole Vb by an electrically conductive layer, a contact, and the first wiring layer 14b that are formed concurrently with the gate wiring layer 12a in order to improve heat release characteristics. For example, in the case where many elements releasing heat are arranged densely, a temperature of the semiconductor substrate 1 may be increased in some cases. It may be desirable that an electrically-conductive member having high heat conductivity be extended to a location close to the support substrate 16 as an auxiliary heat release path in such a case in terms of further effectively functioning heat release on the support substrate 16 side as well. In terms thereof, it may be more desirable that the heat release path utilizing the wiring layer be further extended beyond the first wiring layer illustrated in FIG. 1 to utilize the second wiring layer and the like if space allows.

[1.4 Ground Connection Structure]

In the first wiring layer 14b of FIG. 1, a configuration indicated by the reference symbol "12d" is a wiring layer in which a ground electric potential is supplied from the outside through the illustrated BGA terminal 22 or other BGA terminal unillustrated. Such a wiring layer will be referred to as a ground wiring layer 12d below.

The ground wiring layer 12d is connected to the doped epitaxial polysilicon layer 3a through a contact plug 10. Thereby, when a high-frequency signal is applied to the high-frequency transistor RFT, electric potentials of the doped epitaxial polysilicon layer 3a and the undoped epitaxial polysilicon layer 3b are stabilized to thereby suppress change in the substrate capacity.

Further, the semiconductor substrate 1 may be desirably fixed to a ground electric potential as well. In this case, in the case where the thermal bonding film 20b is formed of an electrically-conductive film such as a metal film, the heat release path Rt2 serves as a ground electric potential fixation path as well, and characteristics stability is further improved.

As described above, in the case where at least one of the third requirement (the heat release structure) and the fourth requirement (the ground connection structure) is applied in addition to the foregoing first requirement and the foregoing second requirement, both heat release and ground connection are achieved. It goes without saying that both the third requirement and the fourth requirement may be desirably applied. However, when one thereof is applied, heat release and ground connection are allowed to be achieved.

Thereby, advantages of effective prevention of lowered high-frequency characteristics of the high-frequency transistor RFT including suppression of high-frequency distortion are obtained.

[1.5 Manufacturing Method]

Next, description will be given of a method of manufacturing the high-frequency semiconductor device according to the first embodiment of the present disclosed technology referring to the drawings. FIG. 2a to FIG. 11b illustrate cross-sectional views of the high-frequency semiconductor device according to the first embodiment. These cross-sectional views illustrate cross sections in the middle of manufacturing corresponding to the cross section of the completed device of FIG. 1.

FIG. 2a to FIG. 2e illustrate an example (a working example) of a method of forming an SOI (silicon on insulator) substrate.

Figure 2A:
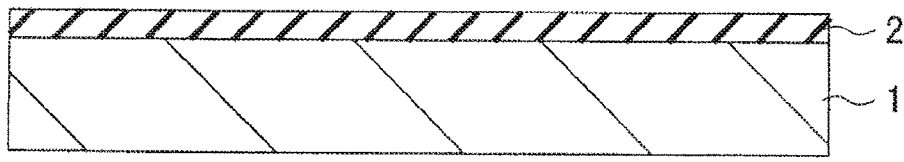
FIG. 2a is a cross-sectional view of a manufacturing process of the high-frequency semiconductor device according to the first embodiment.

As illustrated in FIG. 2a, on the semiconductor substrate (such as a high-resistivity silicon wafer having resistivity of 500 to 2000 $\Omega$cm both inclusive) 1, the first insulation layer 2 is formed. The first insulation layer 2 may be preferably formed of a silicon oxide film, and the thickness thereof may be desirably from 0.1 to 0.5 µm both inclusive. The reason why such a thickness range may be desirable will be described later.

Figure 2B:
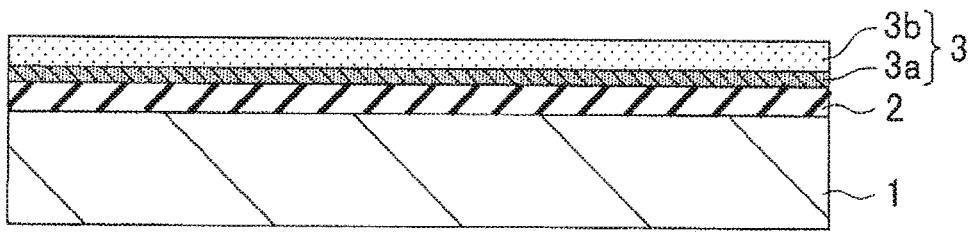
FIG. 2b is a cross-sectional view of a manufacturing process of the high-frequency semiconductor device according to the first embodiment.

Subsequently, as illustrated in FIG. 2b, on the first insulation layer 2, unillustrated amorphous silicon having a thickness, for example, of about 50 to about 300 nm both inclusive may be formed. The amorphous silicon is formed in order to achieve subsequent favorable epitaxial growth. However, the amorphous silicon is not necessarily formed.

Thereafter, the epitaxial polysilicon layer 3a doped with an impurity in high concentration is formed by an epitaxial growth method, and subsequently, the undoped epitaxial polysilicon layer 3b is continuously formed.

A temperature at which the epitaxial polysilicon layer 3a is formed may be, for example, from 1000 to 1050 deg C. both inclusive. The epitaxial polysilicon layer 3a may be formed with the use, for example, of dichlorosilane ($SiH_2Cl_2$). As a raw material of doping, for example, any of diborane ($B_2H_6$), phosphine ($PH_3$), and arsine ($AsH_3$) may be selected. The impurity concentration may be in the range from $1\times10^{17}$ to $1\times10^{21}$ both inclusive [atoms/$cm^3$], and may be desirably about $1\times10^{20}$ [atoms/$cm^3$]. The film thickness of the epitaxial polysilicon layer 3a doped with an impurity in high concentration may be desirably from about 0.5 to about 5.0 μm both inclusive.

Subsequently, the undoped epitaxial polysilicon layer 3b is continuously formed. The undoped epitaxial polysilicon layer may be also formed, for example, at 1000 to 1050 deg C. both inclusive with the use, for example, dichlorosilane. The film thickness of the undoped epitaxial polysilicon layer 3b may be preferably equal to or larger than 45 μm, and may be desirably from 45 to about 50 μm both inclusive. The reason why such a thickness range may be desirable will be described later.

It is to be noted that the undoped epitaxial polysilicon layer 3b may be formed in several batches. Further, it is a characteristic point that out of the two-layer epitaxial polysilicon layer, at least the undoped epitaxial polysilicon layer 3b is in a state of column crystal after growth, and is a low-stress film having film stress of about 2 to about 5 MPa both inclusive (in the foregoing example, both the two layers are in a state of column crystal). In terms thereof, in the present disclosed technology, a state that the "undoped" layer having a larger thickness and having a profound effect on film stress is formed as the "epitaxial polysilicon layer in a state of column crystal" (the first requirement) may be significantly desirable.

Figure 2C:
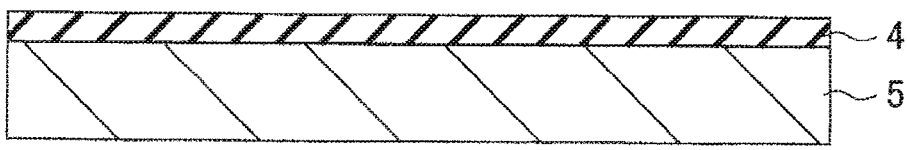
FIG. 2c is a cross-sectional view of a manufacturing process of the high-frequency semiconductor device according to the first embodiment.

Next, as illustrated in FIG. 2c, a semiconductor substrate 5 is newly prepared, and the second insulating layer 4 is formed on the substrate surface.

Figure 2D:
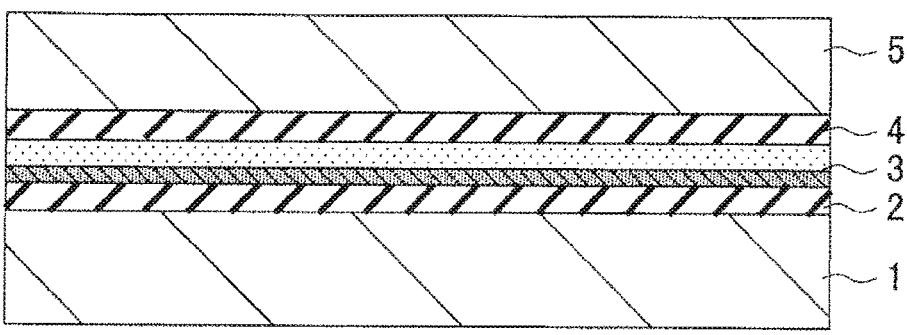
FIG. 2d is a cross-sectional view of a manufacturing process of the high-frequency semiconductor device according to the first embodiment.

Thereafter, as illustrated in FIG. 2d, the semiconductor substrate 1 after finishing the process of FIG. 2b and the semiconductor substrate 5 after finishing the process of FIG. 2c are joined with the use of a known substrate bonding technology.

After bonding the substrates to each other, the semiconductor substrate 5 is cut and ground with the use of a known grinding technology to obtain a desired thickness from the rear surface on the opposite side of the surface on which the bonded second insulating layer 4 exists.

Figure 2E:
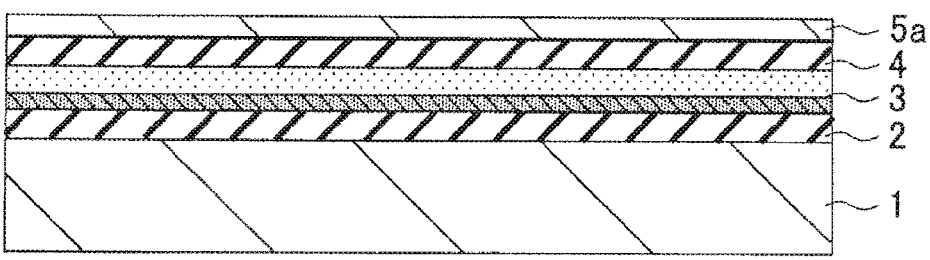
FIG. 2e is a cross-sectional view of a manufacturing process of the high-frequency semiconductor device according to the first embodiment.

After the foregoing cutting and the foregoing grinding, as illustrated in FIG. 2e, the SOI substrate to which the present disclosed technology is applied is obtained.

Next, description will be given of a flow of forming the device on the SOI substrate illustrated in FIG. 2e with the use of FIG. 3a and FIG. 3b.

Figure 3A:
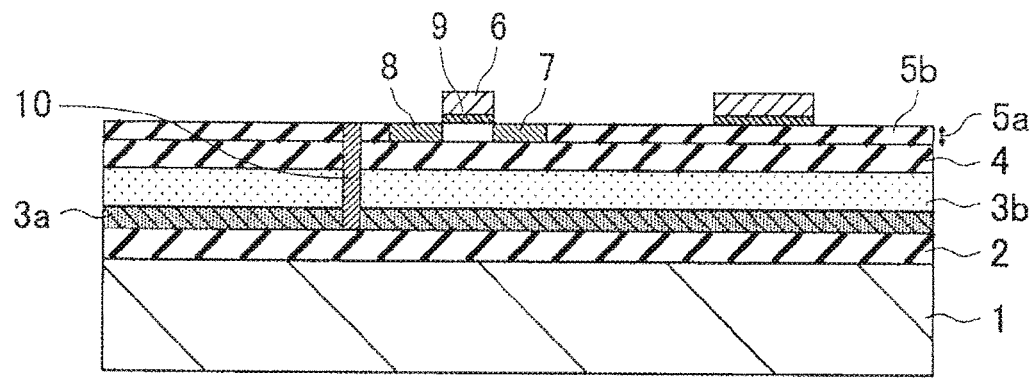
FIG. 3a is a cross-sectional view of a manufacturing process of the high-frequency semiconductor device according to the first embodiment.

In a step illustrated in FIG. 3a by patterning, with the use of an unillustrated resist mask, silicon in a region other than sections in which elements such as an FET (the high-frequency transistor RFT) are formed is etched in the semiconductor substrate 5. A silicon oxide film for forming the element separation layer 5b is buried in the portion of the semiconductor substrate 5 that has been etched.

Thereafter, the surface is planarized by CMP. Thereby, the semiconductor substrate 5 becomes the semiconductor substrate layer 5a having a predetermined thickness. Subsequently, the element separation layer 5b is formed in the semiconductor substrate layer 5a, and a semiconductor layer region other than the element separation layer 5b becomes an active region for forming the elements.

Further, a contact hole reaching a highly-concentrated layer is bored in the vicinity of a location where the FET (the high-frequency transistor RFT) is formed, the bored contact hole is filled with an electrically-conductive material, and an extra portion of the electrically-conductive material is removed. As the electrically-conductive material, for example, amorphous silicon containing an impurity in a high concentration may be suitable. Thereby, as illustrated in FIG. 3a, the contact plug 10 starting at the surface to reach the doped epitaxial polysilicon layer 3a is formed.

The FET is formed with the use of an existing technology.
First, the gate insulating film 9 is formed on the semiconductor substrate. Subsequently, for example, tungsten polycide to become the gate electrode 6 may be formed. The formed tungsten polycide film to become the gate electrode 6 and the formed gate insulating film 9 are processed with the use of lithography and a dry etching technology so that the foregoing gate electrode is left in only a desired region. The gate insulating film 9 may be left around the gate electrode 6 without being processed.

In the lithography and the dry etching, a laminated body having the same structure as that of the gate insulating film 9 and the gate electrode 6 is also left in a location to be connected to the heat release via hole Vb of FIG. 1. Subsequently, the source-drain region 7 and the source-drain region 8 may be formed by selective ion implantation with the use, for example, of an unillustrated mask layer.

Figure 3B:
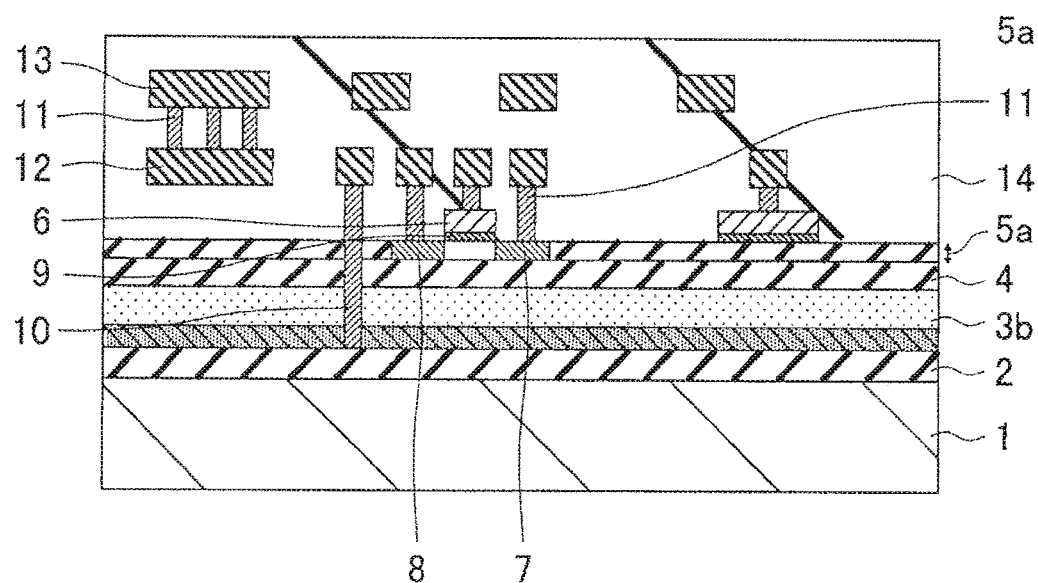
FIG. 3b is a cross-sectional view of a manufacturing process of the high-frequency semiconductor device according to the first embodiment.

Next, as illustrated in FIG. 3b, part of the insulating layer 14 (the first interlayer insulating film 14a illustrated in FIG. 1) is formed, holes are bored in sections corresponding to the source-drain electrodes, the gate wiring layer, and the ground wiring layer in the first interlayer insulating film 14a, the bored holes are filled with an electrically conductive film such as tungsten to form the contact plugs 11.

Further, the first wiring layer 14b, the second interlayer insulating film 14c as part of the insulating layer 14, the second wiring layer 14d, and the third interlayer insulating film 14e as another part of the insulating layer 14 are laminated and formed in this order (for reference symbols of the respective layers, see FIG. 1).

It is to be noted that, in forming the wiring layers such as the first wiring layer 14b, one of a method of processing an electrically conductive film by lithography and a dry etching technology and a method utilizing the so-called damascene interconnect technology may be used.

Further, with regard to formation of the wiring layers and the contact plugs, description has been given of the case of the two-layer structure in this example. However, the number of layers thereof may be any number as necessary.

Description will be given of methods of forming the connection via hole Va and the heat release via hole Vb with the use of FIG. 4a to FIG. 11b.

Figure 4A:
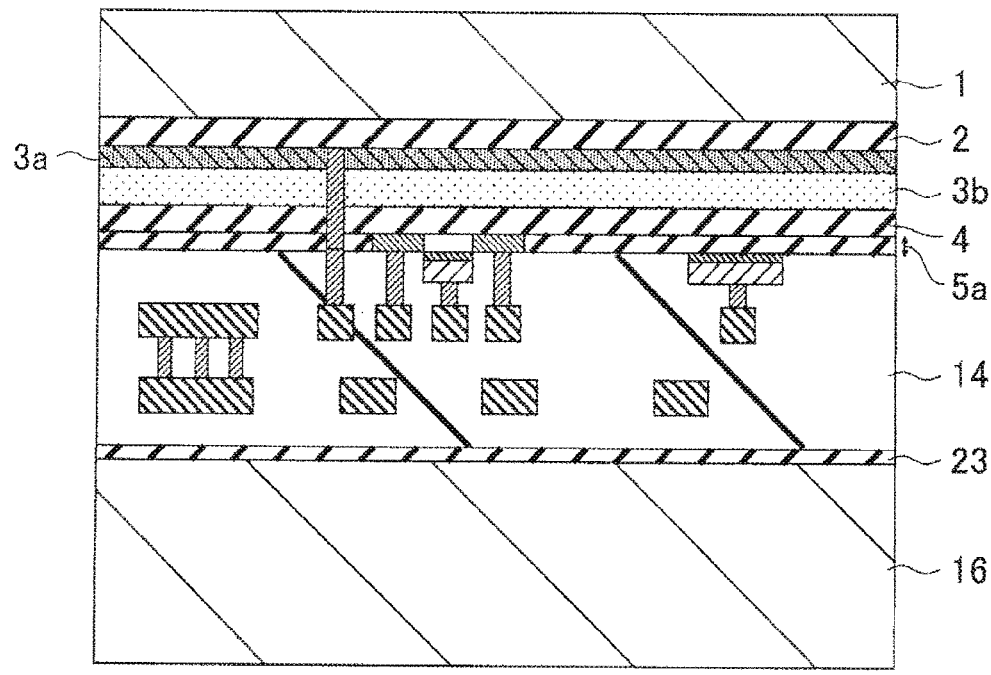
FIG. 4a is a cross-sectional view of a manufacturing process of the high-frequency semiconductor device according to the first embodiment.

As illustrated in FIG. 4a, the insulating support substrate 16 is bonded to the insulating layer 14 side formed by the process of FIG. 3b with the adhesive 23. Any material may be used for the adhesive, as long as the support substrate is allowed to be adhered to the insulating layer 14 side therewith.

Figure 4B:
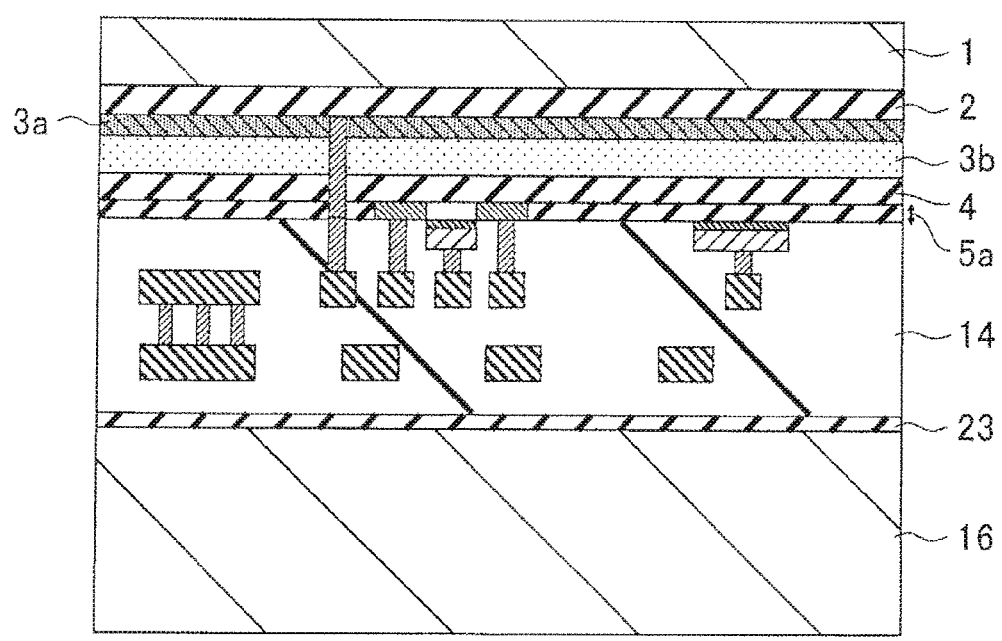
FIG. 4b is a cross-sectional view of a manufacturing process of the high-frequency semiconductor device according to the first embodiment.

Next, as illustrated in FIG. 4b, the semiconductor substrate 1 is thinned with the use of a known technology such as back grinding (BGR).

Figure 5A:
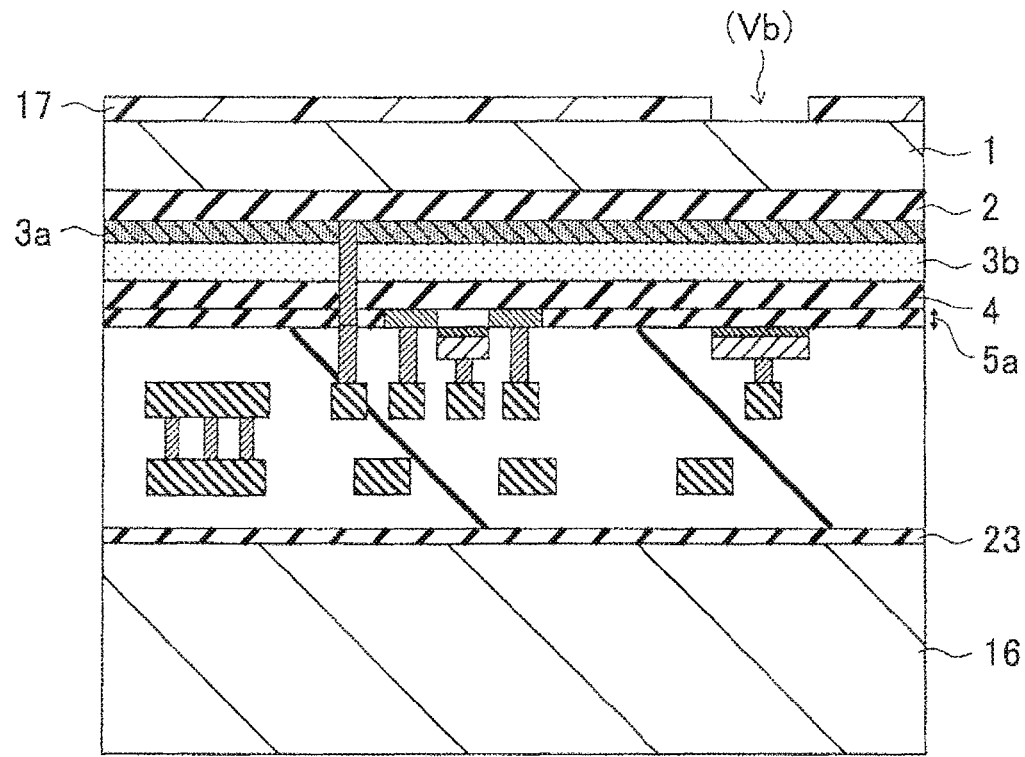
FIG. 5a is a cross-sectional view of a manufacturing process of the high-frequency semiconductor device according to the first embodiment.

Subsequently, as illustrated in FIG. 5a, a resist 17 is formed on the semiconductor substrate 1 thinned in FIG. 4b, and the resist 17 is patterned to bore a hole in a region where the heat release via hole Vb is to be arranged.

Next, processing of the heat release via hole Vb is performed by dry etching so that the internal wall surface of the via hole is formed in a forward tapered shape at the time of the etching.

The etching in a forward tapered shape may be performed according to, for example, the following specific procedure.

Figure 5B:
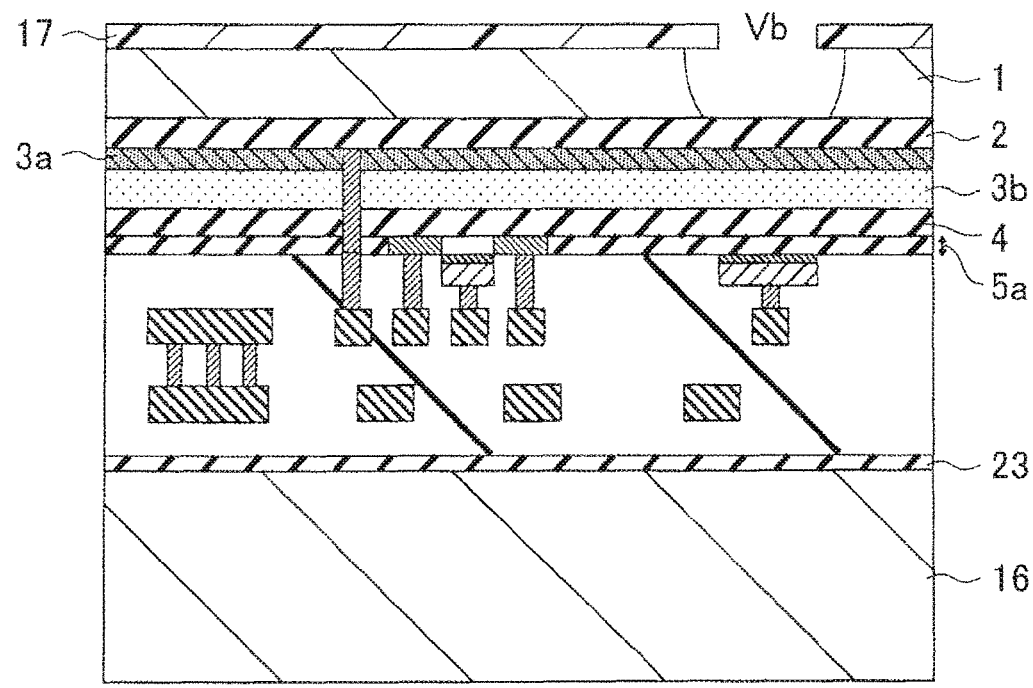
FIG. 5b is a cross-sectional view of a manufacturing process of the high-frequency semiconductor device according to the first embodiment.

As illustrated in FIG. 5b, the semiconductor substrate 1 is processed by a dry etching technology. At this time, the etching is performed so that the first insulating layer 2 configures an etching stopper, and the worked surface is formed in a forward tapered shape.

In order to obtain a forward tapered shape in etching, two-stage type etching that is a so-called Bosch (trade (company) name) type and general one-stage type etching as Non Bosch type are used repeatedly. In the two-stage type etching, a first step in which processing is mainly performed and a second step in which protection of side walls is mainly performed are implemented. The one-stage type etching is an etching including only the foregoing first step and not including the second step.

In the two-stage type etching, for example, mixed gas of sulfur hexafluoride ($SF_6$) and oxygen ($O_2$) may be used in the first step (etching step), and octafluorocyclobutane ($C_4F_8$) is used in the second step (deposition step of a side-wall protective layer).

Further, in the one-stage type etching, mixed gas of sulfur hexafluoride ($SF_6$) and oxygen ($O_2$) is used.

By such an etching method using the two-stage type together with the one-stage type, side surfaces of a processed bore is formed in a forward tapered shape as illustrated in FIG. 5b. In etching with the foregoing gases, when silicon oxide (the first insulating layer 2) is exposed, etching is not progressed with respect to silicon oxide, and the first insulating layer 2 serves as an etching stopper.

Figure 6A:
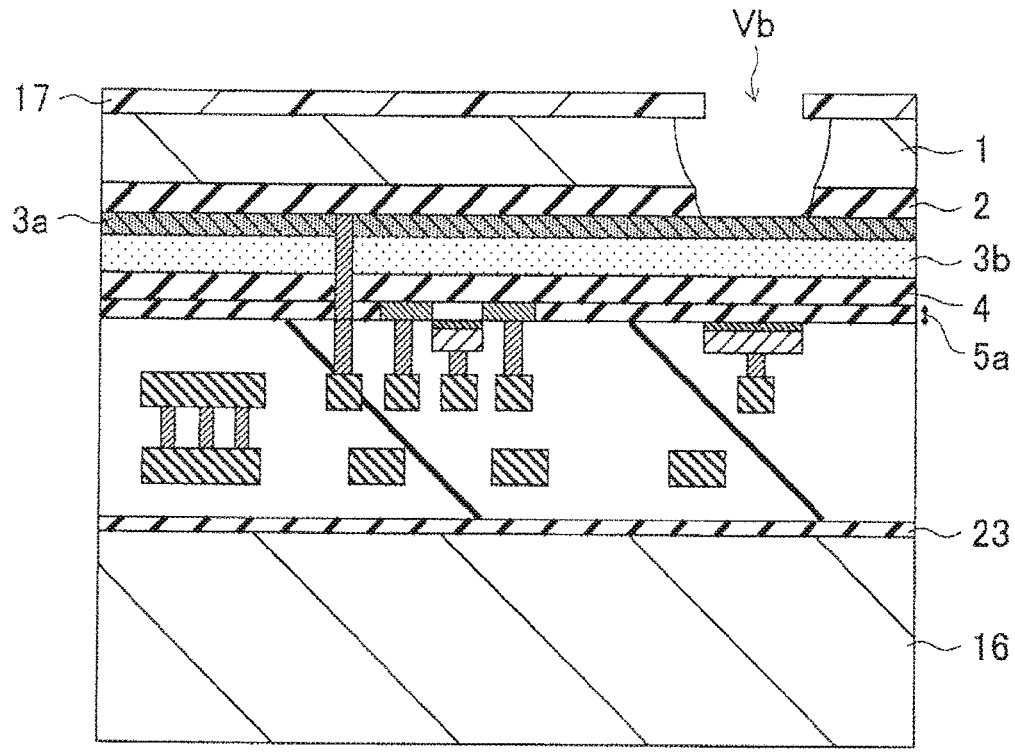
FIG. 6a is a cross-sectional view of a manufacturing process of the high-frequency semiconductor device according to the first embodiment.

Subsequently, as illustrated in FIG. 6a, etching process is progressed by switching to conditions in which the first insulating layer 2 is etched.

In this etching process, mixed gas of tetrafluoromethane (CFA trifluoromethane ($CHF_3$), oxygen ($O_2$), and argon (Ar) is used. The mixed gas used in the etching may be gas other than the foregoing gas, as long as the used gas is fluorine-based gas used at the time of an existing process of an insulating film.

In the etching conditions of the insulating layer, the etching stops progressing at the stage when the doped epitaxial polysilicon layer 3a is exposed, and the doped epitaxial polysilicon layer 3a serves as an etching stopper.

Figure 6B:
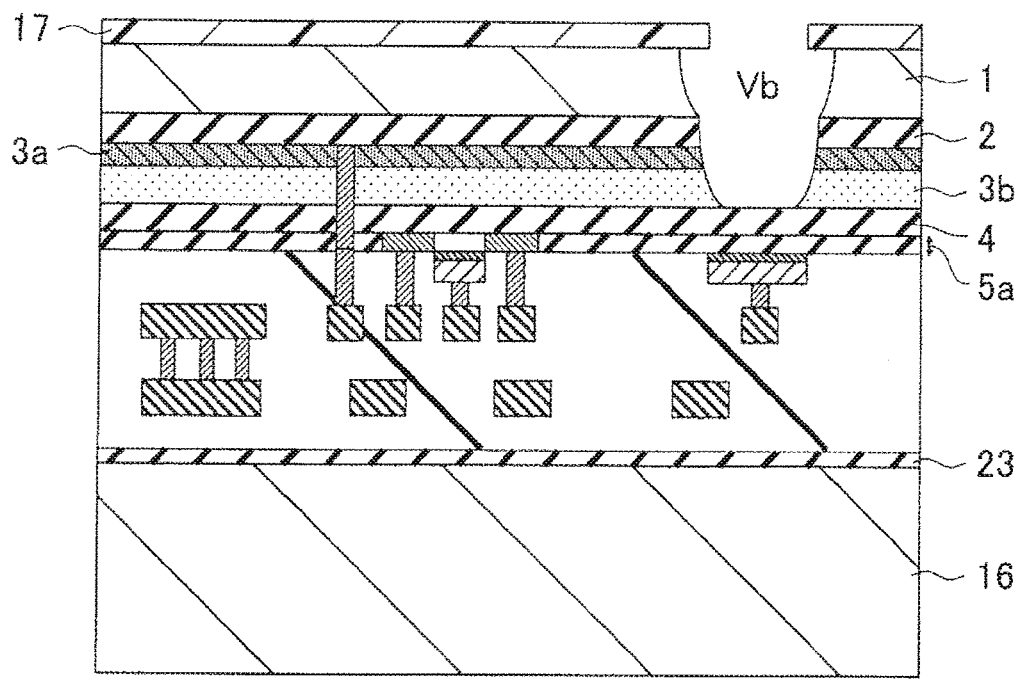
FIG. 6b is a cross-sectional view of a manufacturing process of the high-frequency semiconductor device according to the first embodiment.

Subsequently, as illustrated in FIG. 6b, the epitaxial polysilicon layer (3a and 3b) is subjected to etching process with the use of the second insulating layer 4 as a stopper.

In the etching, the two-stage type etching is used together with the one-stage type etching as in forming the forward tapered shape in the etching of the semiconductor substrate 1 described above.

In the two-stage type etching, for example, mixed gas of sulfur hexafluoride ($SF_6$) and oxygen ($O_2$) may be used in the first step (etching step), and octafluorocyclobutane ($C_4F_8$) is used in the second step (deposition step of a side-wall protective layer).

Further, in the one-stage type etching, mixed gas of sulfur hexafluoride ($SF_6$) and oxygen ($O_2$) is used.

By such an etching method using the two-stage type together with the one-stage type, side surfaces of the processed bore is formed in a forward tapered shape as illustrated in FIG. 6b. In etching with the foregoing gases, when silicon oxide (the second insulating layer 4) is exposed, etching stops progressing with respect to silicon oxide, and the second insulating layer 4 serves as an etching stopper.

Thereafter, the resist 17 is peeled off.

Next, description will be given of processing of the connection via hole Va with the use of FIG. 7a to FIG. 9b.

The connection via hole Va is processed in a reverse tapered shape by dry etching.

Figure 7A:
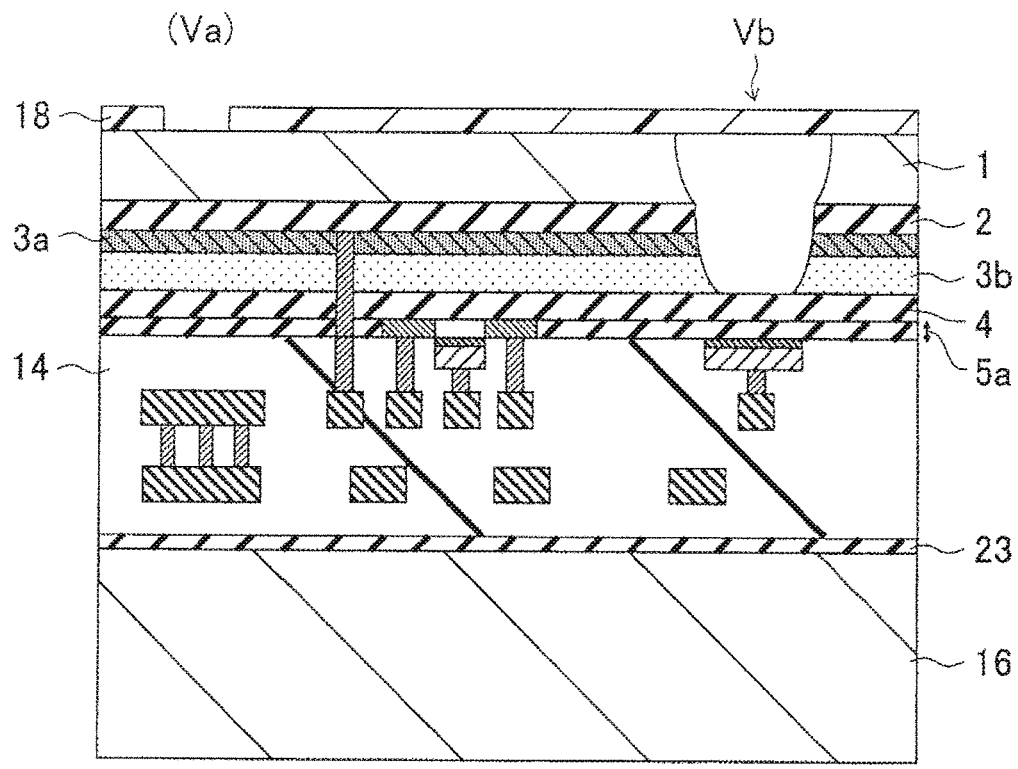
FIG. 7a is a cross-sectional view of a manufacturing process of the high-frequency semiconductor device according to the first embodiment.

First, as illustrated in FIG. 7a, a dry film resist 18 having high dry etching resistance is formed to pattern a section in which the connection via hole Va is bored. At this time, the opening of the heat release via hole Vb is sealed with the dry film resist 18.

Figure 7B:
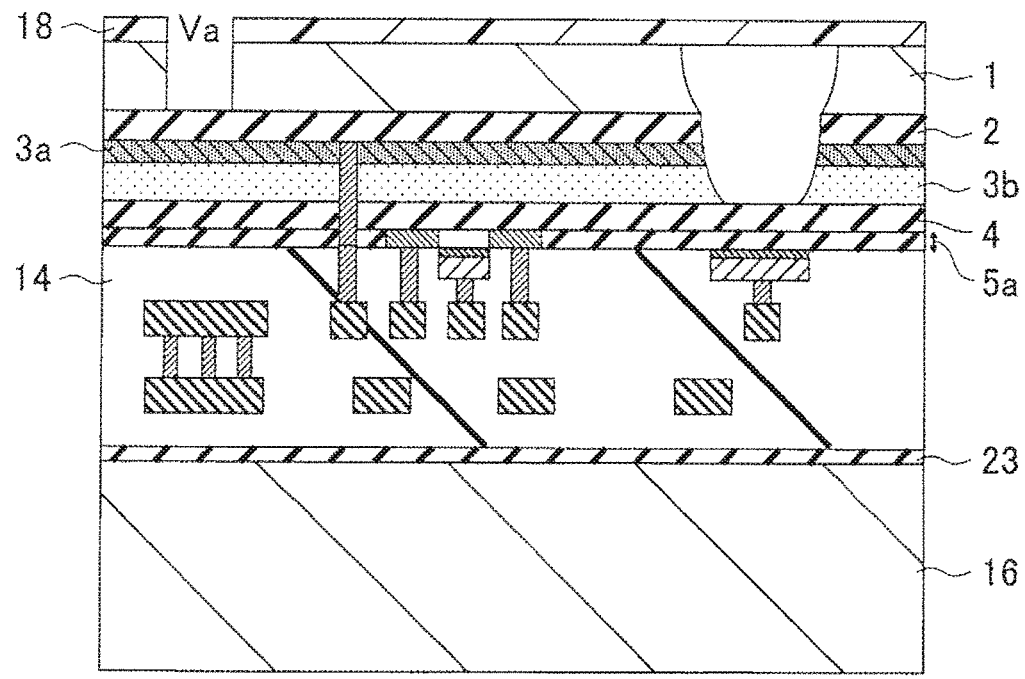
FIG. 7b is a cross-sectional view of a manufacturing process of the high-frequency semiconductor device according to the first embodiment.

Next, as illustrated in FIG. 7b, the semiconductor substrate 1 is processed by etching with the use of the first insulating layer 2 as a stopper.

In such etching, two-stage type etching in which mixed gas of sulfur hexafluoride ($SF_6$) and oxygen ($O_2$) is used in the first step (etching step), and octafluorocyclobutane ($C_4F_8$) is used in the second step (deposition step) is performed. Thereby, as illustrated in FIG. 7b, side surfaces of the bore of the semiconductor substrate 1 are formed in a reverse tapered shape.

Figure 8A:
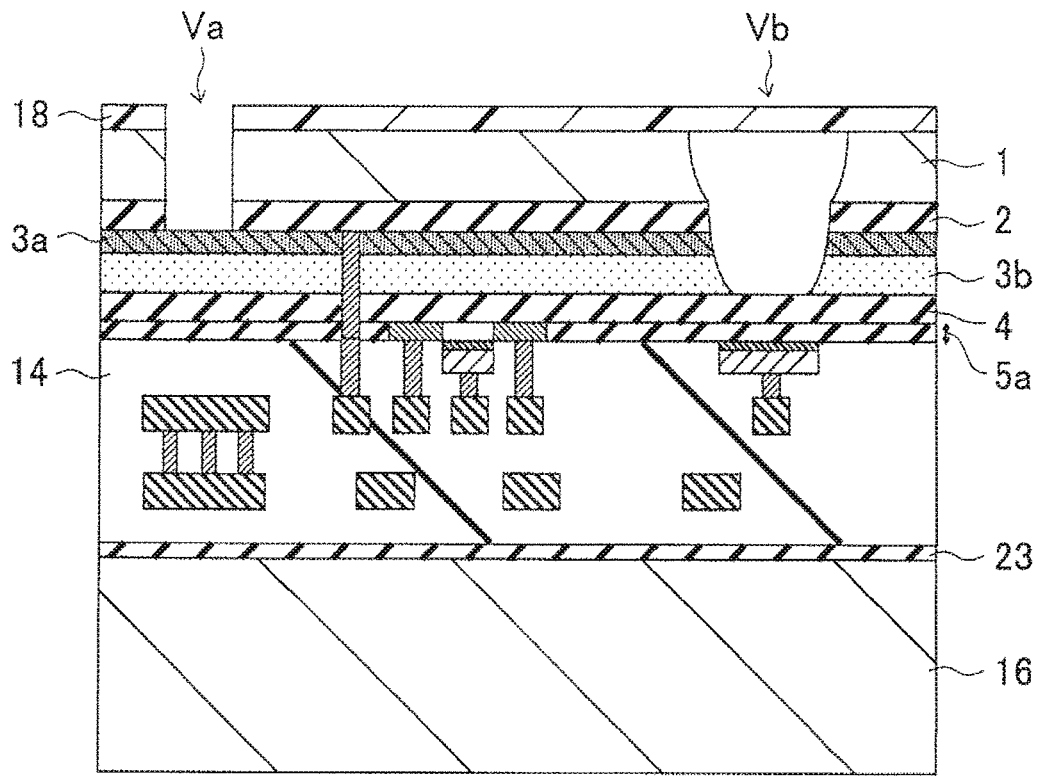
FIG. 8a is a cross-sectional view of a manufacturing process of the high-frequency semiconductor device according to the first embodiment.

Next, as illustrated in FIG. 8a, the first insulating layer 2 is processed by etching with the use of the epitaxial polysilicon layer (3a and 3b) as a stopper.

In the etching, mixed gas of tetrafluoromethane ($CF_4$), trifluoromethane ($CHF_3$), oxygen ($O_2$), and argon (Ar) is used.

It is to be noted that the mixed gas used in the etching process may be gas other than the foregoing gas, as long as the used gas is fluorine-based gas used at the time of an existing process of an insulating film.

Figure 8B:
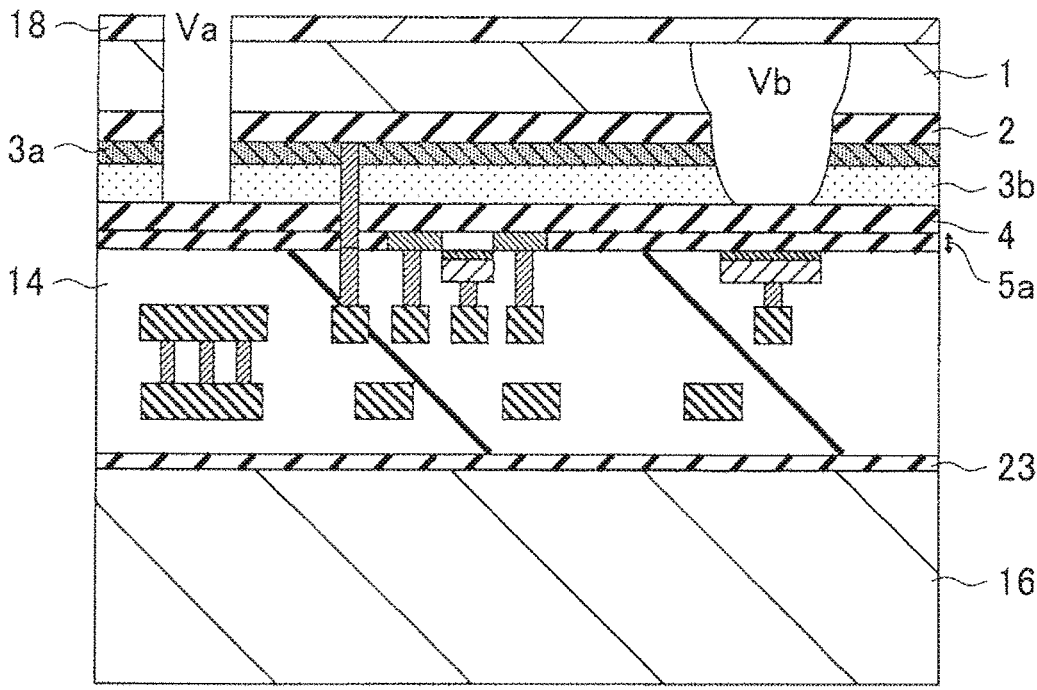
FIG. 8b is a cross-sectional view of a manufacturing process of the high-frequency semiconductor device according to the first embodiment.

Next, as illustrated in FIG. 8b, the epitaxial polysilicon layer (3a and 3b) is processed by etching with the use of the second insulating layer 4 as a stopper.

In the etching, by two-stage type etching in which mixed gas of sulfur hexafluoride ($SF_6$) and oxygen ($O_2$) is used in the first step (etching step), and octafluorocyclobutane ($C_4F_8$) is used in the second step (deposition step), processing is performed to obtain a reverse tapered shape.

Figure 9A:
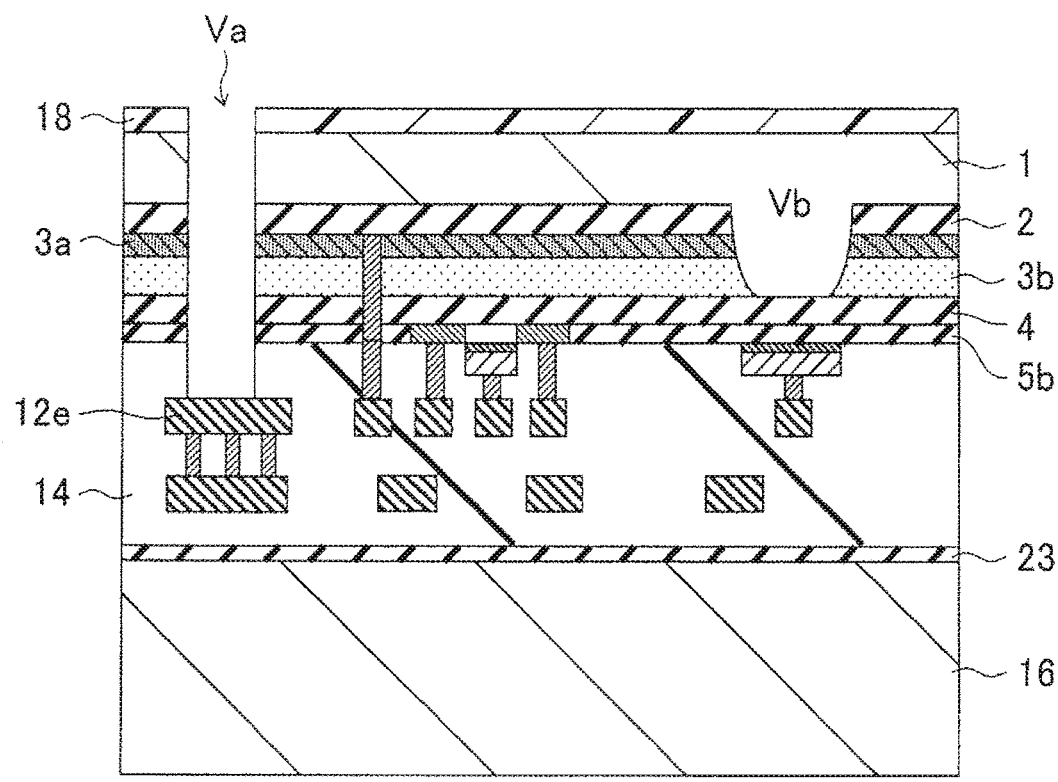
FIG. 9a is a cross-sectional view of a manufacturing process of the high-frequency semiconductor device according to the first embodiment.
Figure 9B:
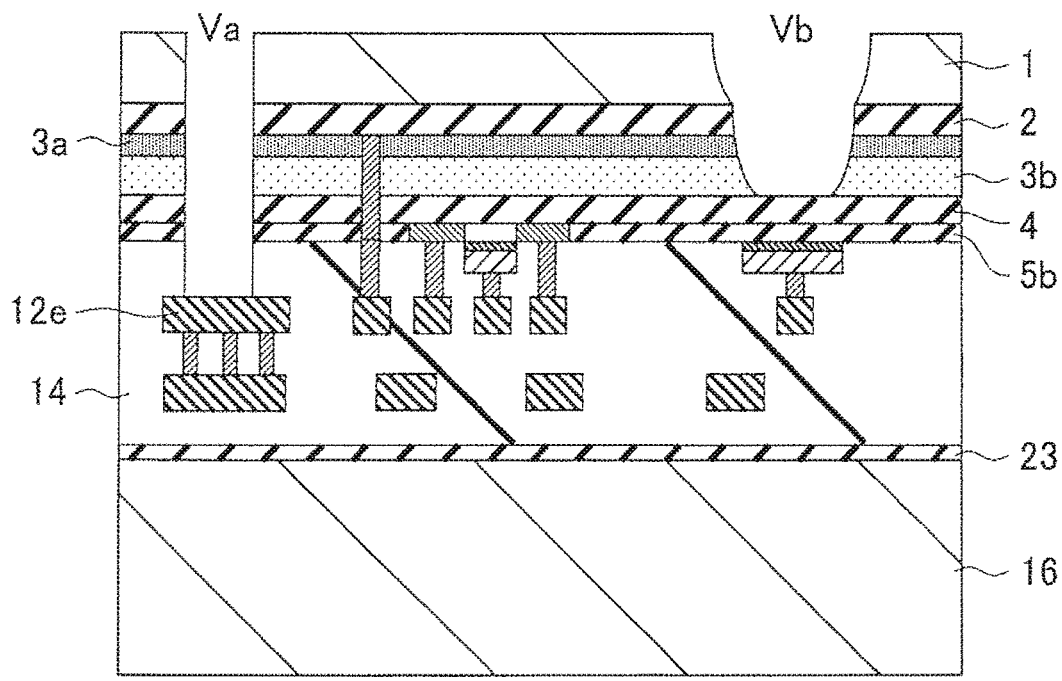
FIG. 9b is a cross-sectional view of a manufacturing process of the high-frequency semiconductor device according to the first embodiment.

Next, as illustrated in FIG. 9a, the second insulating layer 4, the element separation layer 5b, and the insulating layer 14 (more accurately, the first interlayer insulating film 14a) are processed by etching with the use of the wiring layer 12e configuring the first wiring layer as a stopper.

In such etching conditions, the etching is performed with the use of mixed gas of tetrafluoromethane ($CF_4$), trifluoromethane ($CHF_3$), oxygen ($O_2$), and argon (Ar).

The mixed gas used in the etching may be gas other than the foregoing gas, as long as the used gas is fluorine-based gas used at the time of an existing process of an insulating film. Further, the foregoing gas is used in the case where an insulating film to be etched is made of silicon oxide, and used gas may be changed as appropriate according to the insulating film type.

Thereafter, the dry film resist 18 used at the time of processing the connection via hole Va is peeled off.

Description will be given of processes of forming the connection film 20a in the connection via hole Va, and concurrently forming the thermal bonding film 20b in the heat release via hole Vb with the use of FIG. 10a to FIG. 11b.

Figure 10A:
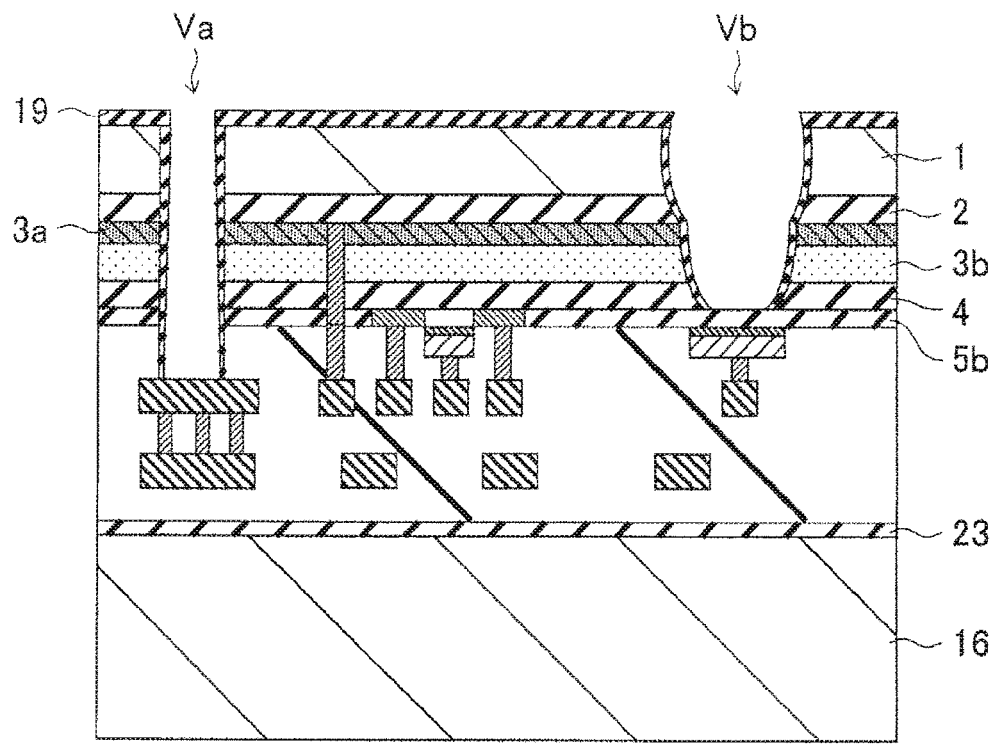
FIG. 10a is a cross-sectional view of a manufacturing process of the high-frequency semiconductor device according to the first embodiment.

First, as illustrated in FIG. 10a, the insulating film 19 is formed. The insulating film 19 is formed with the use of plasma CVD.

Figure 10B:
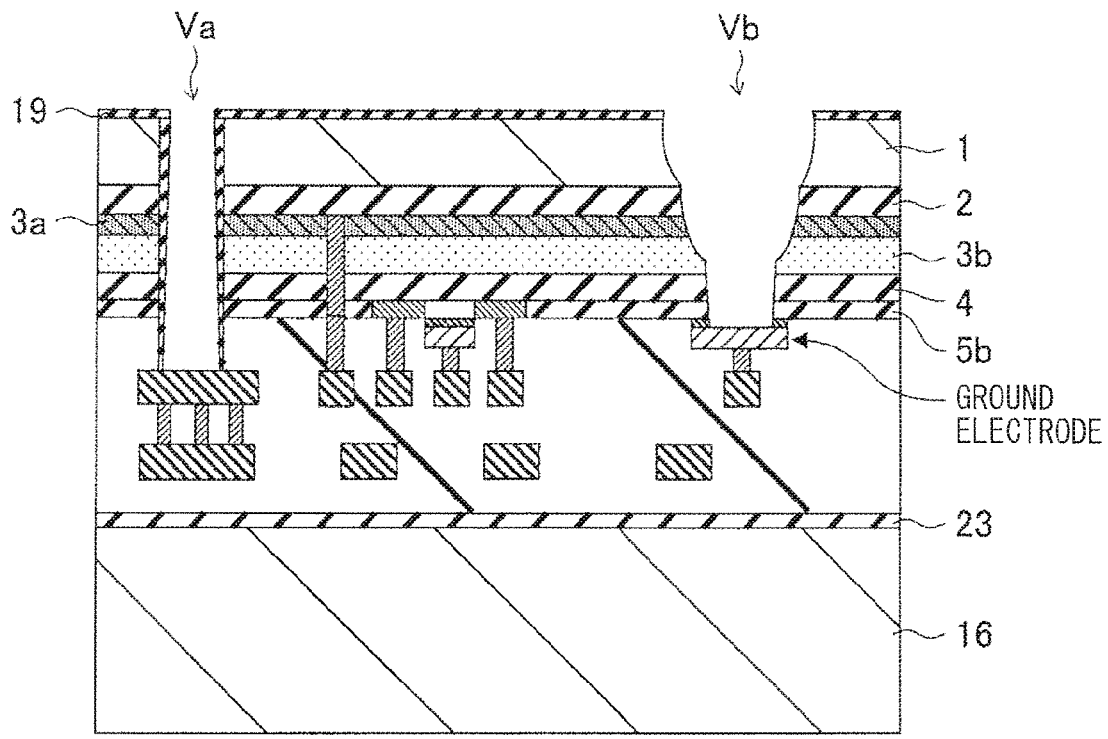
FIG. 10b is a cross-sectional view of a manufacturing process of the high-frequency semiconductor device according to the first embodiment.

Subsequently, as illustrated in FIG. 10b, whole-surface etchback is performed on the insulating film 19 formed in FIG. 10a. As etching conditions, conditions having high anisotropy are adopted with the use of mixed gas of tetrafluoromethane ($CF_4$), trifluoromethane ($CHF_3$), oxygen ($O_2$), and argon (Ar). The mixed gas used in the anisotropic etching may be gas other than the foregoing gas, as long as the used gas is fluorine-based gas used at the time of an existing process of an insulating film. Further, the foregoing gas is used in the case where an insulating film to be etched is made of silicon oxide, and used gas may be changed as appropriate according to the insulating film type.

It is to be noted that at this time, there is a point that must be kept in mind. That is, the insulating film 19 is left on the side walls of the connection via hole Va, and the insulating film 19 is removed from the side walls of the heat release via hole Vb. Such leaving and removing the insulating film 19 are achieved by forming the two via holes by setting of the aspect ratios of the connection via hole Va and the heat release via hole Vb and the side surface shapes (the taper angles) thereof that are previously determined, and by optimizing the film thickness of the insulating film 19 and the etching conditions. The film formation amounts of the insulating film 19 on the side walls and the bottoms of the via holes are adjusted by the film thickness of the insulating film 19 and the etching conditions.

Further, with regard to the heat release via hole Vb, the etching conditions are adjusted so that etching is performed until the ground electrode made of gate polysilicon that has been formed concurrently with the gate electrode 6 is exposed at the time of the whole-surface etchback of the insulating film 19 (FIG. 10b).

Figure 11A:
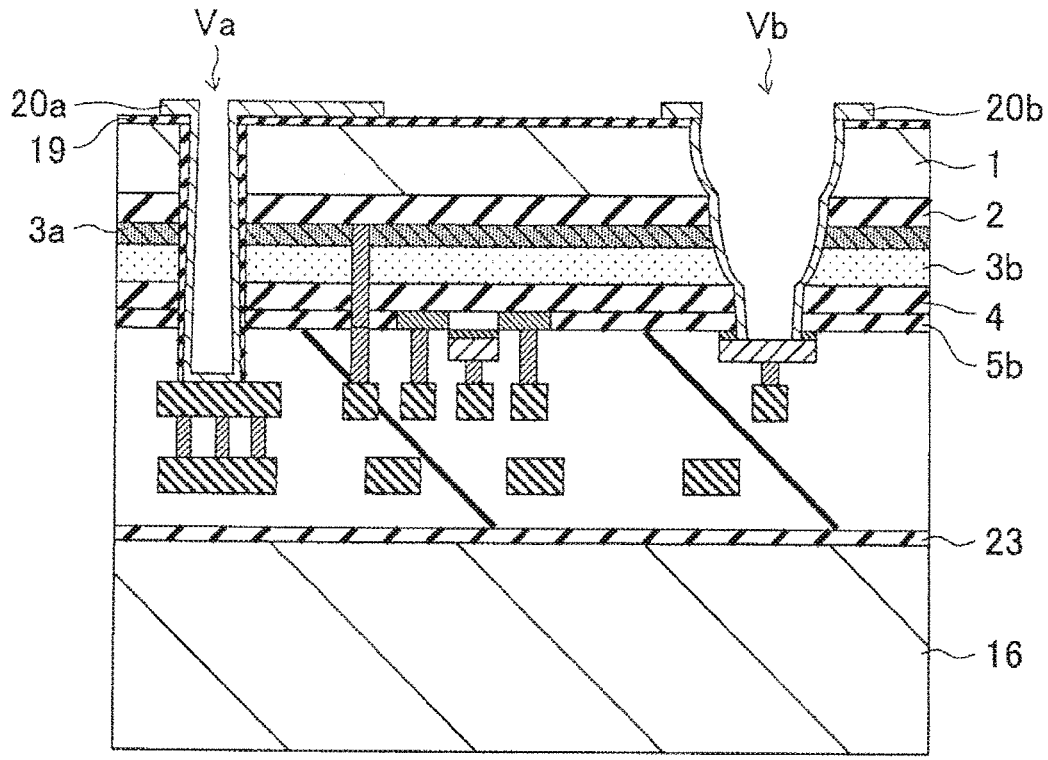
FIG. 11a is a cross-sectional view of a manufacturing process of the high-frequency semiconductor device according to the first embodiment.

Next, although not illustrated in FIG. 11a, a seed metal is formed, and a plating mask layer to expose a section desired to be wired is patterned. When plating is performed in this state, the connection film 20a is formed in the connection via hole Va as illustrated in FIG. 11a, and the thermal bonding film 20b is formed in the heat release via hole Vb as illustrated in the figure. It is to be noted that a method other than the plating method is adoptable, as long as the adopted method is allowed to favorably form the electrically-conductive films (20a and 20b) in the internal wall surfaces of both the reverse-tapered via hole and the forward-tapered via hole. After forming the wiring layer by plating, the plating mask layer and the seed metal thereunder are removed.

Figure 11B:
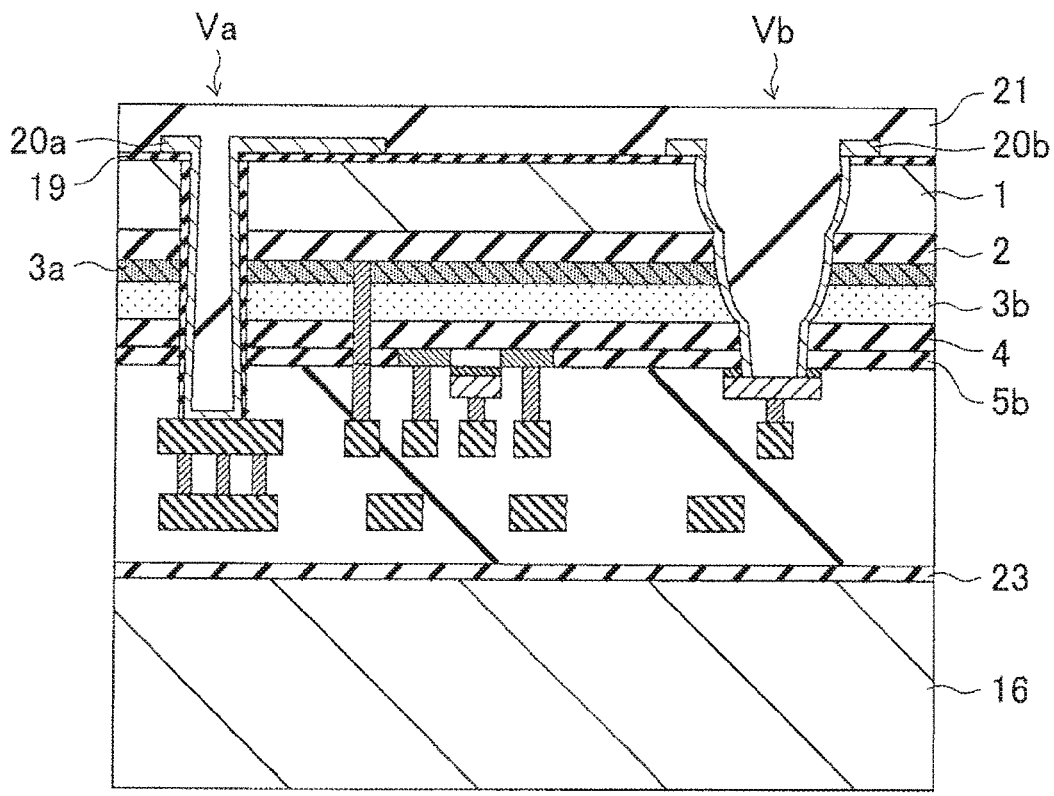
FIG. 11b is a cross-sectional view of a manufacturing process of the high-frequency semiconductor device according to the first embodiment.

Thereafter, the whole surface is coated with the resin 21 as illustrated in FIG. 11b, and the BGA terminal 22 is formed in a desired location as illustrated in FIG. 1. Thereby, the high-frequency semiconductor device RFD1 is completed.

In this manufacturing method, in particular, by forming the via holes having different two taper angles, whether or not the insulating film 19 is left on the wall surfaces of the via holes is controllable. Therefore, even in the case of a via hole having a high aspect ratio, electric connection with or insulation from the epitaxial polysilicon layer (3a or 3b) is easily controlled on the internal wall surface side of the via hole by presence or absence of the insulating film 19.

Description will be given below of a second embodiment to a fourth embodiment.

These embodiments are obtained by partly modifying the structure of FIG. 1 illustrated in the foregoing first embodiment as a basis. Therefore, in the drawings used for the following description, for structures and manufacturing methods that are common to those of FIG. 1 to FIG. 11b, the same referential symbols are affixed and description thereof will be omitted or simplified.

2. Second Embodiment

Figure 12:
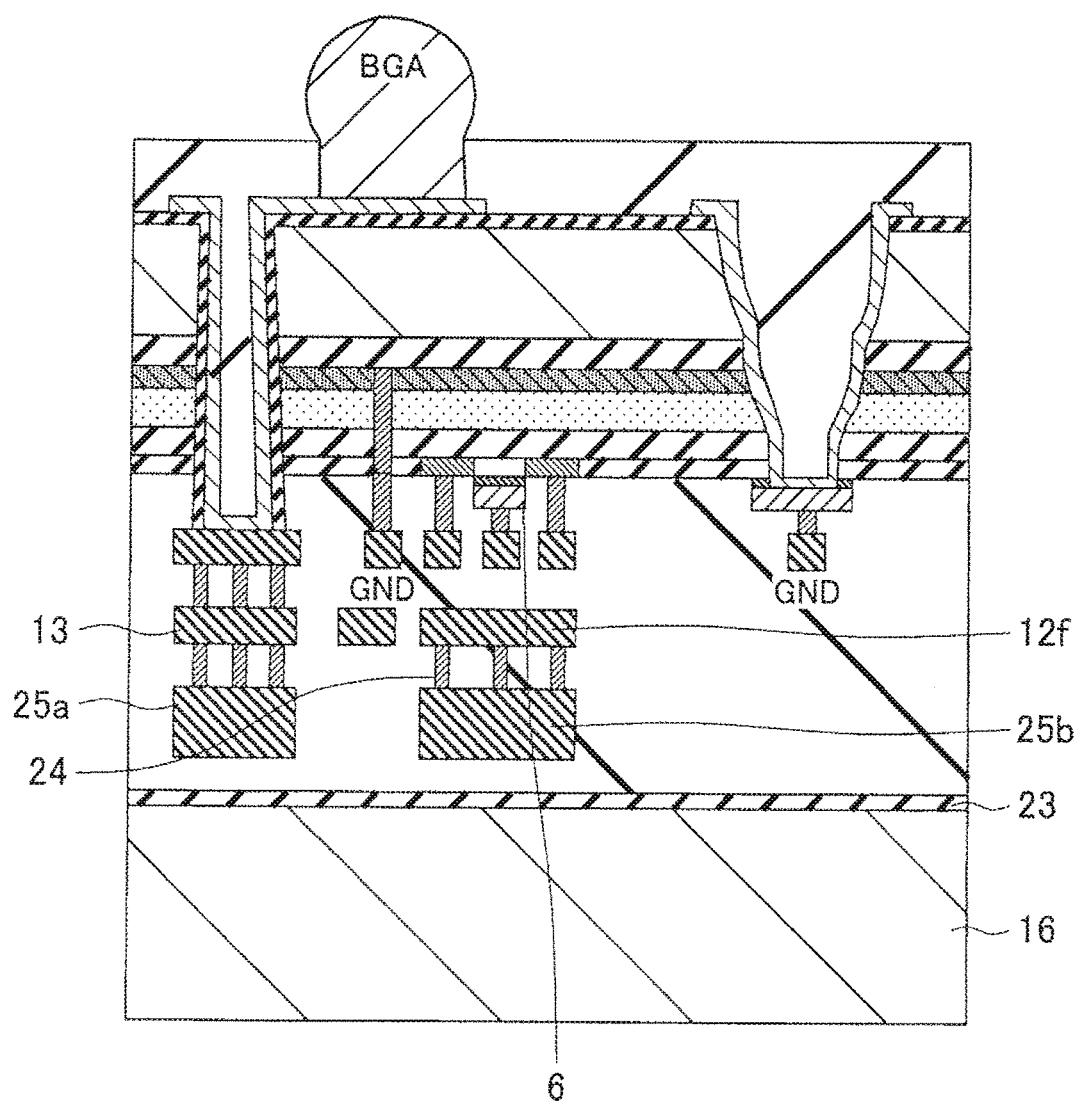
FIG. 12 is a schematic cross-sectional view of a main section of a high-frequency semiconductor device according to a second embodiment.

FIG. 12 illustrates a cross-sectional view of a main section in this embodiment corresponding to FIG. 1 in a high-frequency semiconductor device RFD 2.

The high-frequency semiconductor device RFD 2 (FIG. 12) according to this embodiment is different from the high-frequency semiconductor device RFD 1 (FIG. 1) according to the first embodiment in that the high-frequency semiconductor device RFD 2 additionally includes a heat release metal.

The foregoing heat release metal is also called a "dummy wiring section." The "dummy wiring section" is different from a wiring layer that is electrically connected directly to the high-frequency transistor RFT or indirectly to the high-frequency transistor RFT through other element as the second wiring layer 14d illustrated in FIG. 1. The "dummy wiring section" refers to an electrically conductive layer that is not connected to other electrically-conductive member used as a wiring of a circuit or an element in itself. It is to be noted that the "dummy wiring section" may be configured of a single wiring layer or the plurality of wiring layers. Further, as long as the structure thereof including a contact connecting a plurality of wiring layers to one another is not connected to other electrically-conductive member used as a wiring of a circuit or an element, such a structure is included in the concept of the "dummy wiring section."

At the time of forming the multilayer wiring of FIG. 3b described in the foregoing first embodiment, the "dummy wiring section as a structure" is formed above the first wiring layer (the gate electrode 6 and the like) located above the high-frequency transistor RFT.

Specifically, as illustrated in FIG. 12, at the time of forming the second wiring layer (such as the wiring layer 13) of FIG. 1, a heat release metal 12f is formed. Further, in the third interlayer insulating film 14e (see FIG. 1), contact plugs 24 are formed by a method similar to that used for forming the contact plugs 11 (see FIG. 1).

Further, at the time of forming a third wiring layer 25a (see FIG. 1), a heat release metal 25b connected to the contact plugs 24 is formed.

A structure formed of the heat release metal 12f, the contact plugs 24, and the heat release metal 25b configures the "dummy wiring section."

The contact plugs 24 are not necessarily provided. However, the heat release metals 12f and 25b may be desirably connected through the contact plugs 25 in order to perform heat conduction effectively.

With regard to formation of the wiring layers to configure the heat release metals and formation of the contact plugs, the number of layers thereof may be unlimited according to the device type and the heat release amount. Each of the heat release metals 12f and 25b may desirably have a structure not electrically connected to elements outside and inside the device.

Figure 13A:
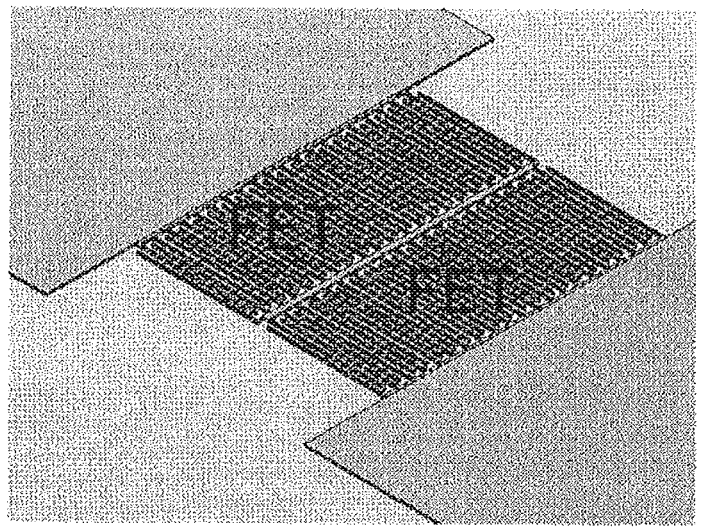
FIG. 13a is an explanatory diagram of an arrangement of heat release metals in the high-frequency semiconductor device according to the second embodiment.
Figure 13B:
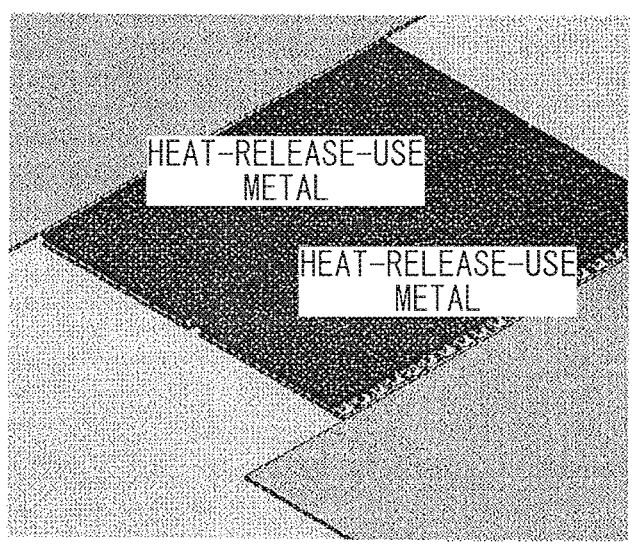
FIG. 13b is an explanatory diagram of the arrangement of the heat release metals in the high-frequency semiconductor device according to the second embodiment.

As illustrated in FIG. 13a, in some cases, a plurality of stages of FETs (high-frequency transistors RFT or unit transistors thereof) are arranged in series. In this case, as illustrated in FIG. 13b, two or more heat release metals may be desirably separated from one another for every high-frequency transistor RFT or for every unit transistor thereof.

Figure 14:
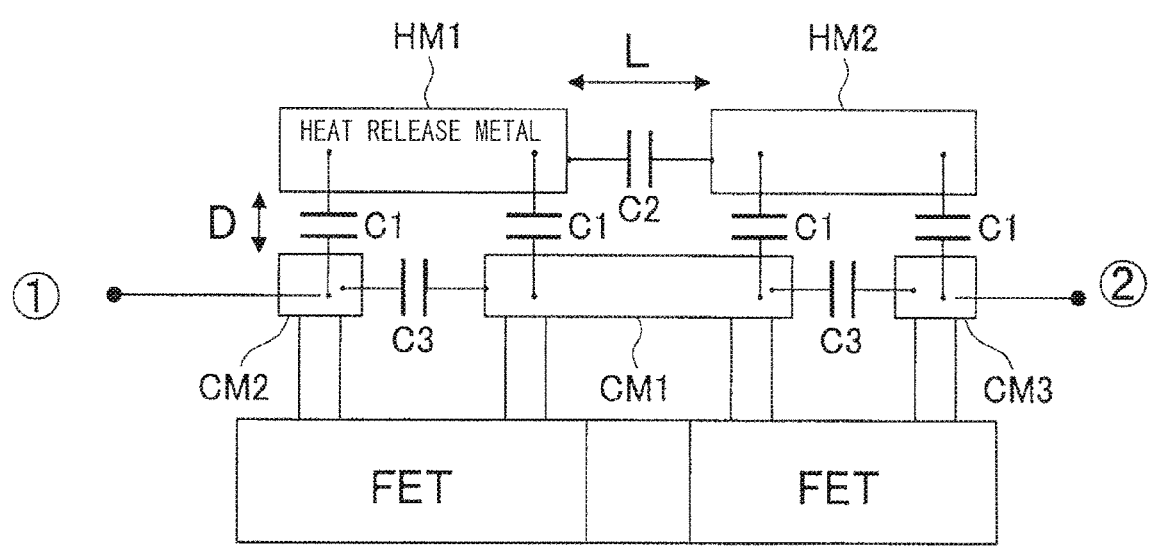
FIG. 14 is a schematic cross-sectional diagram in the case where heat release metals are provided in the high-frequency semiconductor device according to the second embodiment.

FIG. 14 is a schematic cross sectional diagram in the case where heat release metals HM1 and HM2 are separately provided for two TFTs.

In FIG. 14, a source of one FET and a drain of the other FET are connected by a wiring metal CM1. Wiring metals CM2 and CM3 are wiring layers to which the other source and the other drain of the two FETs are connected. The wiring metals CM1, CM2, and CM3 are formed as the first wiring layer 14b as the gate electrode 6 or the source-drain electrodes 12b and 12c in FIG. 1.

In FIG. 14, referential symbol C1 refers to a capacity through the second interlayer insulating film 14c in FIG. 1, referential symbol C2 refers to an inter-wiring-metal capacity, and referential symbol C3 refers to an inter-wiring-metal capacity.

Further, referential symbol L refers to an inter-heat release metal distance, and referential symbol D refers to a distance corresponding to a film thickness of the second interlayer insulating film 14c of FIG. 1.

Figure 15:
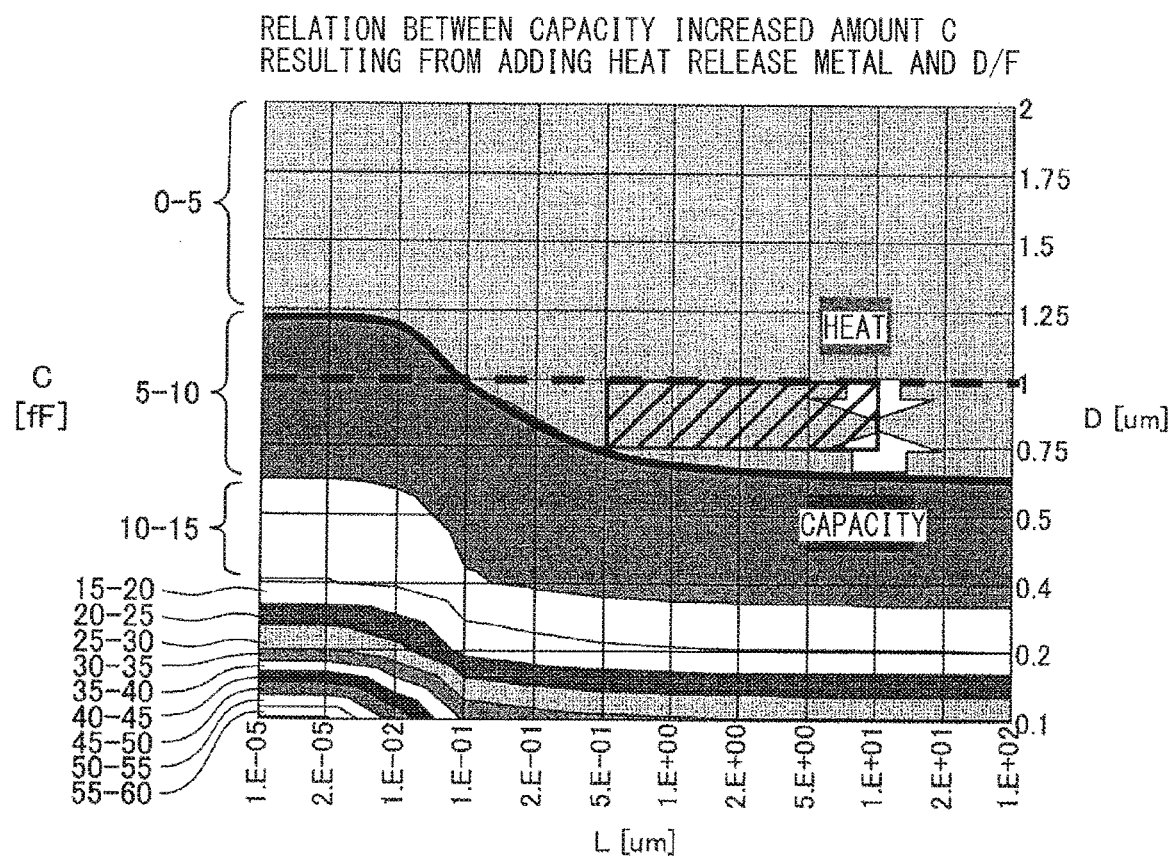
FIG. 15 is a diagram illustrating a result of consideration in the high-frequency semiconductor device according to the second embodiment.

FIG. 15 illustrates a result of estimating a relation among an increased capacity value C obtained by adding the heat release metals and the distances L and D on the premise of the structure of FIG. 14.

In FIG. 15, the increased capacity value C is indicated in the left vertical axis of the graph, the distance (hereinafter referred to as the inter-wiring distance D) corresponding to the film thickness of the second interlayer insulating film is indicated in the right vertical axis of the graph, and the inter-heat release metal distance is indicated in the horizontal axis of the graph.

A parasitic capacitance is determined by the distance L between the heat release metals and the distance D between a heat release metal and a wiring connected to the FET. Such distances may be preferably in the ranges of L=0.5 to 1.0 μm both inclusive and D=0.75 to 1.0 μm both inclusive. It is to be noted that such preferable ranges are indicated by a shaded rectangle region in FIG. 15.

With regard to such a region, the upper limit (1.0 μm) of the distance L between the heat release metals is determined by a requisition based on a fact that if such a distance is excessively large, the areas of the heat release metals are decreased resulting in lowered heat release characteristics, and the like. Further, the lower limit (0.5 μm) of the distance L between the heat release metals is determined by a requisition that a capacitor C is equal to or less than 5 fF.

Similarly, the lower limit (0.75 μm) of the inter-wiring distance D is determined by a requisition that the capacitor C is equal to or less than 5 fF. In contrast, the upper limit (1.0 μm) thereof is determined by the allowable upper limit value (120 deg C) of device heating temperature.

From the foregoing estimation result, it is found that a range in which heat release characteristics are allowed to be improved exists without increasing a parasitic capacitance as a factor to lower device characteristics.

Therefore, effectiveness of this embodiment obtained by adding the "dummy wiring section" to the structure illustrated in the first embodiment has been demonstrated.

3. Third Embodiment

In the foregoing first embodiment, the support substrate 16 is a substrate made of glass or the like, and whether or not an element is formed thereon is not described.

This embodiment demonstrates that an element (mainly a passive element) may be formed on the support substrate 16 side as well.

[3.1 Cross-Sectional Structure]

Figure 16:
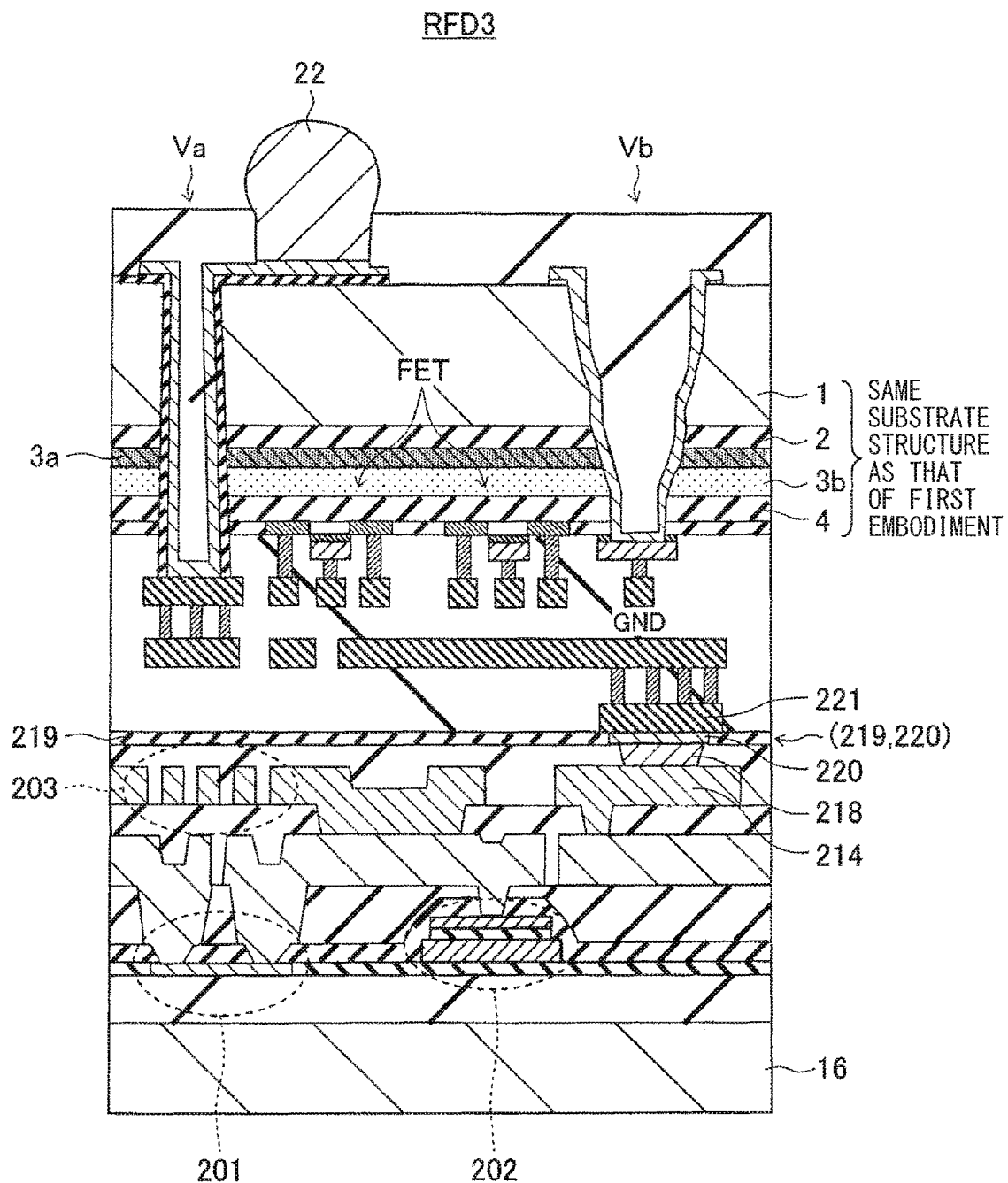
FIG. 16 is a schematic cross-sectional view of a main section of a high-frequency semiconductor device according to a third embodiment.

FIG. 16 illustrates a cross-sectional view of a main section according to this embodiment corresponding to FIG. 1 in a high-frequency semiconductor device RFD 3 according to this embodiment.

In FIG. 16, between an adhesive layer (219 and 220) and the support substrate 16, a multilayer wiring structure for forming a group of passive elements occupying a comparatively large area, that is, a resistor 201, a capacitor 202, and an inductor 203.

[3.2 Manufacturing Method]

Description will be given of a manufacturing method including methods of forming the resistor 201, the capacitor 202, and the inductor 203 with the use of FIG. 17a to FIG. 20c. In the manufacturing method, a method of forming the semiconductor substrate 1 on the high-frequency transistor RFT side is based on the method that has been disclosed and described in FIG. 2a to FIG. 3b. Description will be given below in detail of a method of forming the passive elements on the support substrate 16 in parallel with or before such forming of the substrate. With regard to processes from subsequent bonding of the substrates to methods of forming various via holes, the BGA terminal 22, and the like, description thereof is simplified since such processes are based on those of the first embodiment.

Figure 17A:
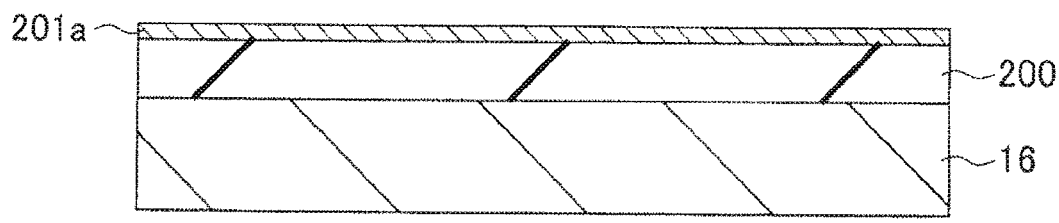
FIG. 17a is a cross-sectional view of a manufacturing process of the high-frequency semiconductor device according to the third embodiment.
Figure 17B:
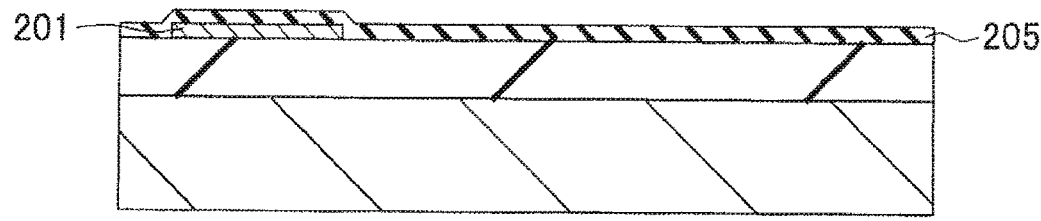
FIG. 17b is a cross-sectional view of a manufacturing process of the high-frequency semiconductor device according to the third embodiment.

First, on the support substrate 16 formed of a glass substrate or a high-resistance silicon substrate, a silicon oxide film 200 is formed by a plasma CVD method. Thereafter, a TaN (tantalum nitride) film 201a to configure a resistor is formed (FIG. 17a). By processing such a TaN (tantalm nitride) film 201a, the resistor 201 is formed (FIG. 17b). The TaN film 201a is processed by dry etching or wet etching with the use of a resist (not illustrated) patterned correspondingly to the shape of the resistor as a mask layer. Thereafter, a silicon oxide film 205 is formed on the whole surface covering the formed resistor 201 by a plasma CVD method.

Figure 17C:
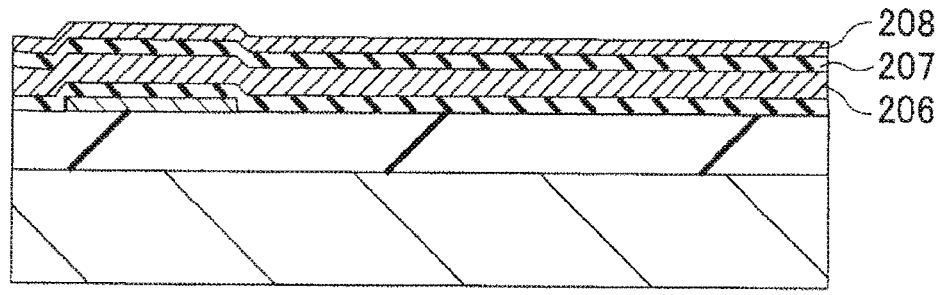
FIG. 17c is a cross-sectional view of a manufacturing process of the high-frequency semiconductor device according to the third embodiment.

Next, a metal film 206 formed of a composite film of Ti (titanium)/TiN (titanium nitride) is formed. On the metal film 206, a dielectric film 207 formed of a Ta (tantalum) oxide film, a silicon oxynitride film, or the like is formed. Further, on the dielectric film 207, a metal film 208 formed of a composite film of Ti/TiN is formed (FIG. 17c).

Figure 17D:
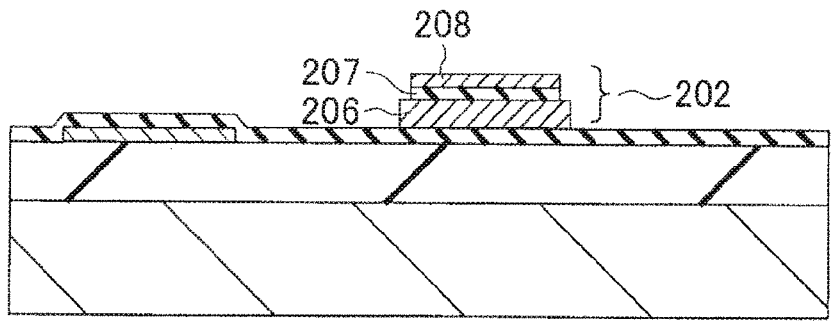
FIG. 17d is a cross-sectional view of a manufacturing process of the high-frequency semiconductor device according to the third embodiment.

On the metal film 208, a resistor patterned correspondingly to the pattern of the capacitor is formed, and dry etching is performed with the use of the formed resistor as a mask layer. At this time, the metal film 208, the dielectric film 207, and the metal film 206 are removed in portions other than the capacitor section to form the capacitor 202 (FIG. 17d).

Figure 18A:
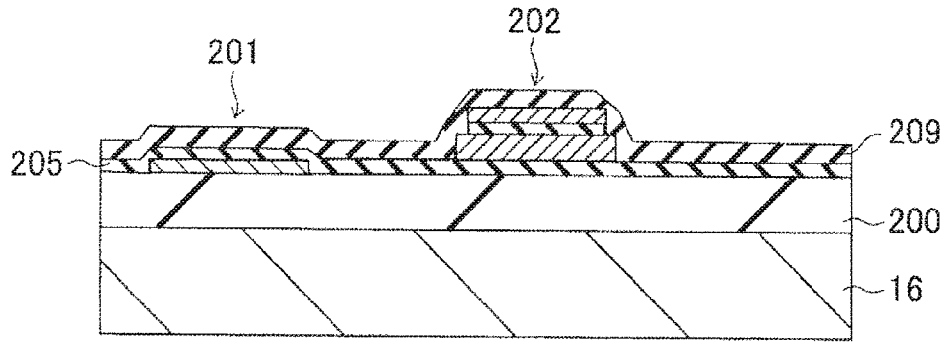
FIG. 18a is a cross-sectional view of a manufacturing process of the high-frequency semiconductor device according to the third embodiment.
Figure 18B:
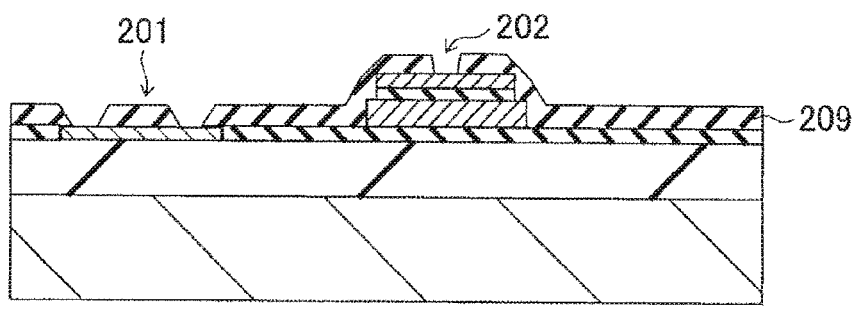
FIG. 18b is a cross-sectional view of a manufacturing process of the high-frequency semiconductor device according to the third embodiment.

After forming the foregoing capacitor 202, a silicon oxide film 209 is formed by a plasma CVD method (FIG. 18a). A resist (not illustrated) to bore holes in part of the silicon oxide film 209 is formed in order to bore holes in sections where wiring layers of the resistor and the capacitor are connected. Portions of the silicon oxide film 209 exposed in the openings of the resist are removed by isotropic dry etching and wet etching to bore the holes, and thereby, the metal film 208 as a foundation or part of the resistor 201 is exposed (FIG. 18b).

Thereafter, an insulating layer 210 of the first layer is formed with the use of a photosensitive BCB (a divinyltetramethylsiloxanebenzocyclobutene resin) or the like, and the surface of the substrate (the surface of the insulating layer 210 of the first layer) is smoothed. With respect to the insulating layer 210 of the first layer, an unillustrated resist is formed, exposed, and developed, and thereby, patterning is performed. Openings of the wiring connection sections are obtained by etching with the use of the resistor as a mask.

The foregoing insulating layer 210 of the first layer may be made of photosensitive polyimide or the like instead of BCB.

Figure 18C:
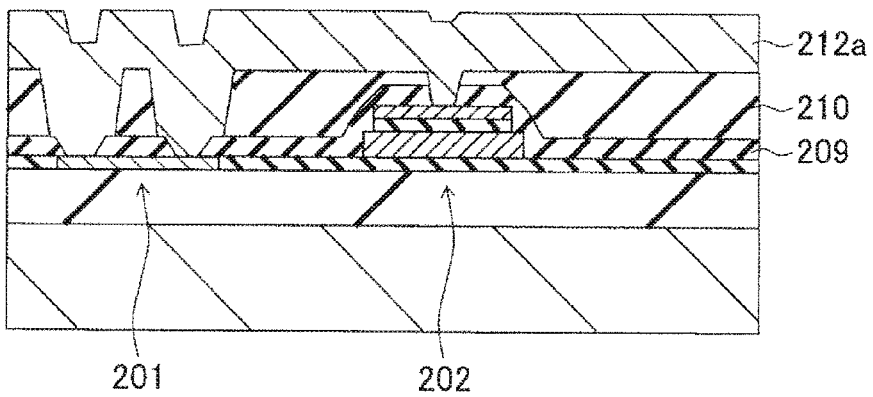
FIG. 18c is a cross-sectional view of a manufacturing process of the high-frequency semiconductor device according to the third embodiment.

Next, on the insulating layer 210 of the first layer, first, a Ti film is formed by a PVD (physical vapor deposition) method. With the use of the Ti film as an electrode, a film 212a to configure a wiring layer of the second layer made of copper (Cu) or the like is formed by an electrolytic plating method (FIG. 18c).

Figure 18D:
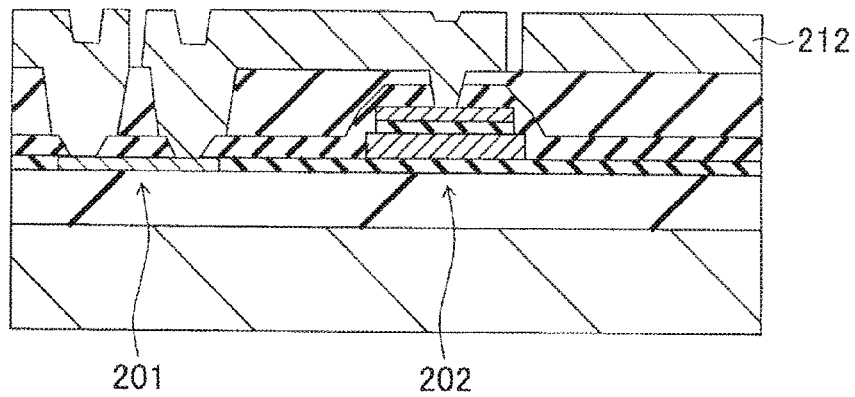
FIG. 18d is a cross-sectional view of a manufacturing process of the high-frequency semiconductor device according to the third embodiment.

On the Ti/Cu electrically-conducive film (the film 212a to configure an electrically-conducive film of the first layer), a resist (not illustrated) is formed and patterning is performed. A wiring layer 212 of the first layer is formed by dry etching or wet etching with the use of the resist as a mask (FIG. 18d).

Figure 19A:
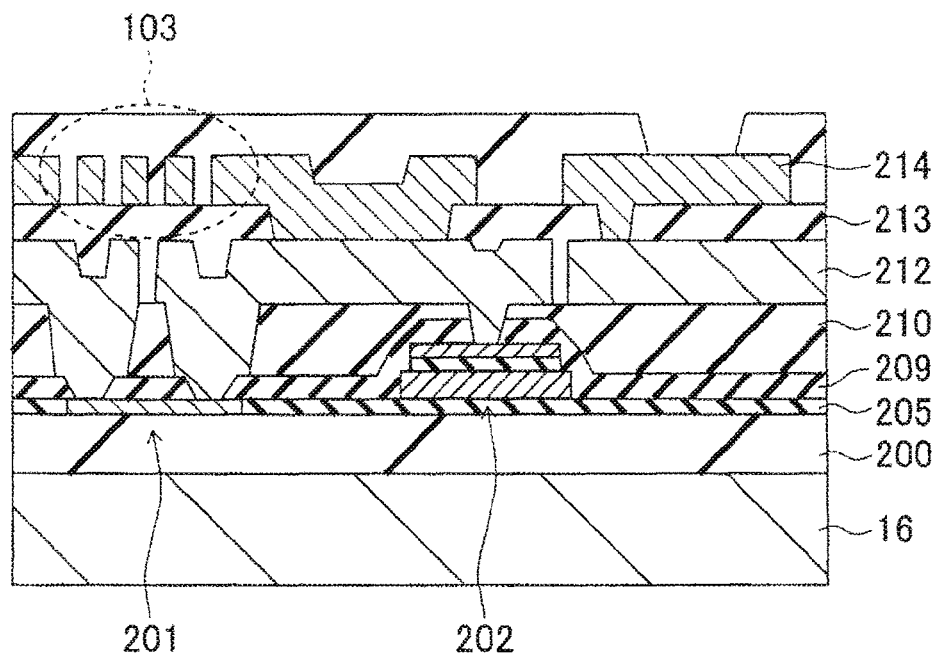
FIG. 19a is a cross-sectional view of a manufacturing process of the high-frequency semiconductor device according to the third embodiment.

As in the foregoing processes from forming the insulating layer 210 of the first layer to forming the wiring layer 212 of the first layer, formation of an insulating film and a wiring layer is repeated to form an insulating layer 213 of the second layer and a wiring layer 214 of the second layer. At the time of forming the wiring layer of the second wiring layer, part of the pattern thereof is formed into a spirally-wound pattern, and thereby, an inductor 203 is formed (FIG. 19a).

Figure 19B:
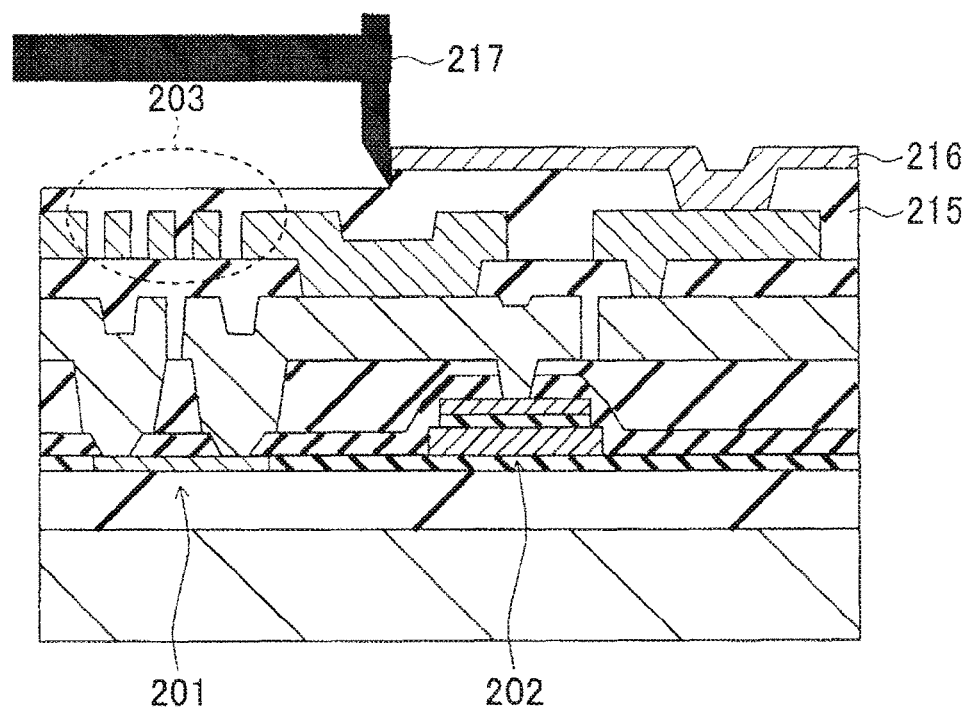
FIG. 19b is a cross-sectional view of a manufacturing process of the high-frequency semiconductor device according to the third embodiment.

Next, as in the foregoing processes from forming the insulating layer 210 of the first layer to forming the wiring layer 212 of the first layer, an insulating layer 215 of the third layer and a metal film (a wiring layer 216 of the third layer) made of Cu or the like are formed by an electrolytic plating method (FIG. 19b).

Thereafter, with the use of a wafer planer 217, the metal film (the wiring layer 216 of the third layer) and the insulating layer 215 of the third layer are cut to planarize the surface of the multilayer film formed on the support substrate 16.

Figure 20A:
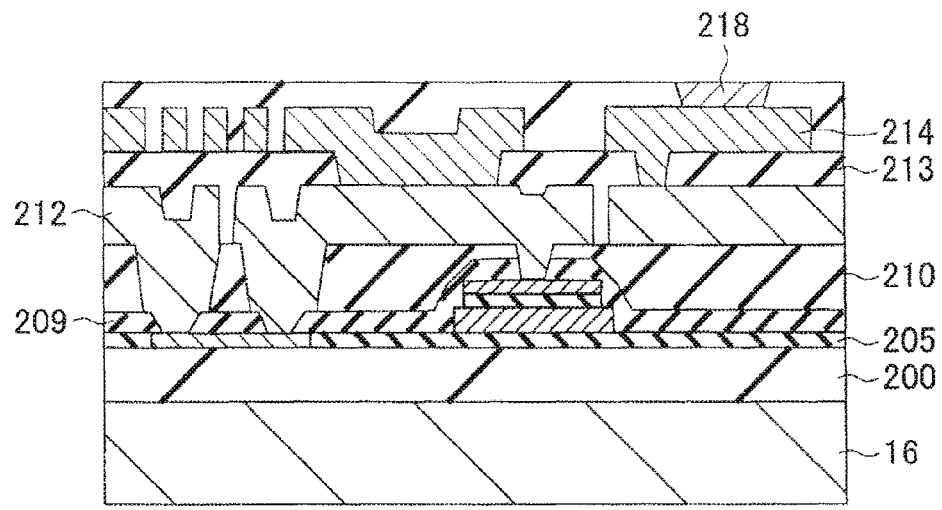
FIG. 20a is a cross-sectional view of a manufacturing process of the high-frequency semiconductor device according to the third embodiment.

Subsequently, on the wiring layer 214 of the second layer electrically connected to the resistor 201 and the capacitor 202 that are provided on the lower layer side close to the support substrate 16 and the inductor 203 provided on the upper layer side, a connection electrode 218 is formed (FIG. 20a).

Figure 20B:
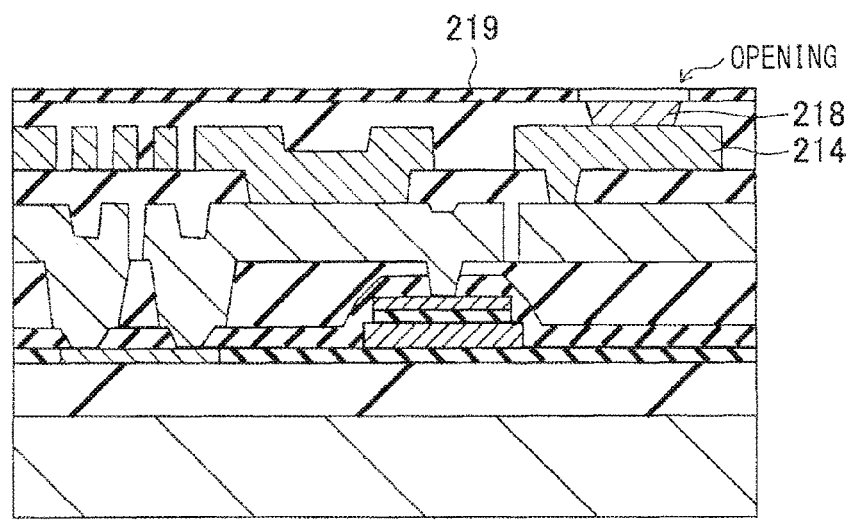
FIG. 20b is a cross-sectional view of a manufacturing process of the high-frequency semiconductor device according to the third embodiment.

The uppermost surface (the insulating layer into which the connection electrode 218 is buried) of the support substrate after formation of the connection electrode 218 is coated with a photosensitive bonding adhesive 219 (an insulating adhesive). By selectively exposing and developing a partial region of the bonding adhesive 219, an opening on the connection electrode 218 is formed in the bonding adhesive 219 (FIG. 20b).

Figure 20C:
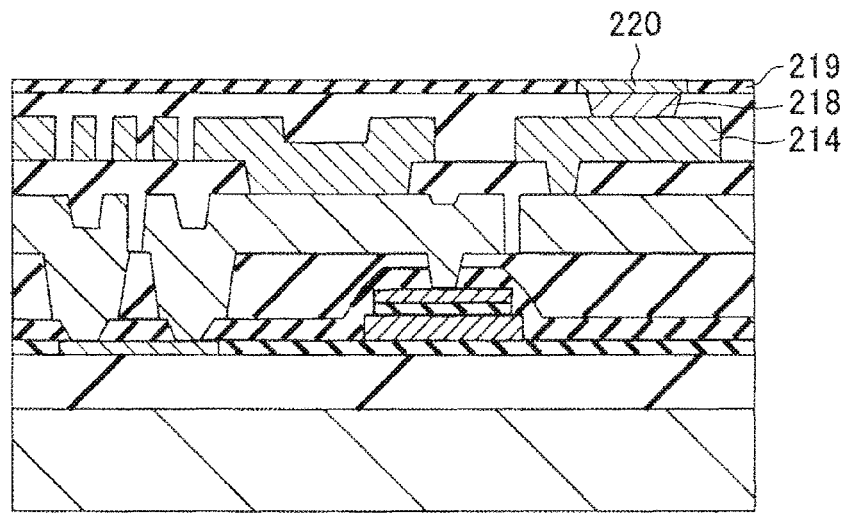
FIG. 20c is a cross-sectional view of a manufacturing process of the high-frequency semiconductor device according to the third embodiment.

The opening of the bonding adhesive 219 is coated with an electrically-conductive adhesive resin 220 containing an electrically-conductive filler (FIG. 20c).

Figure 21:
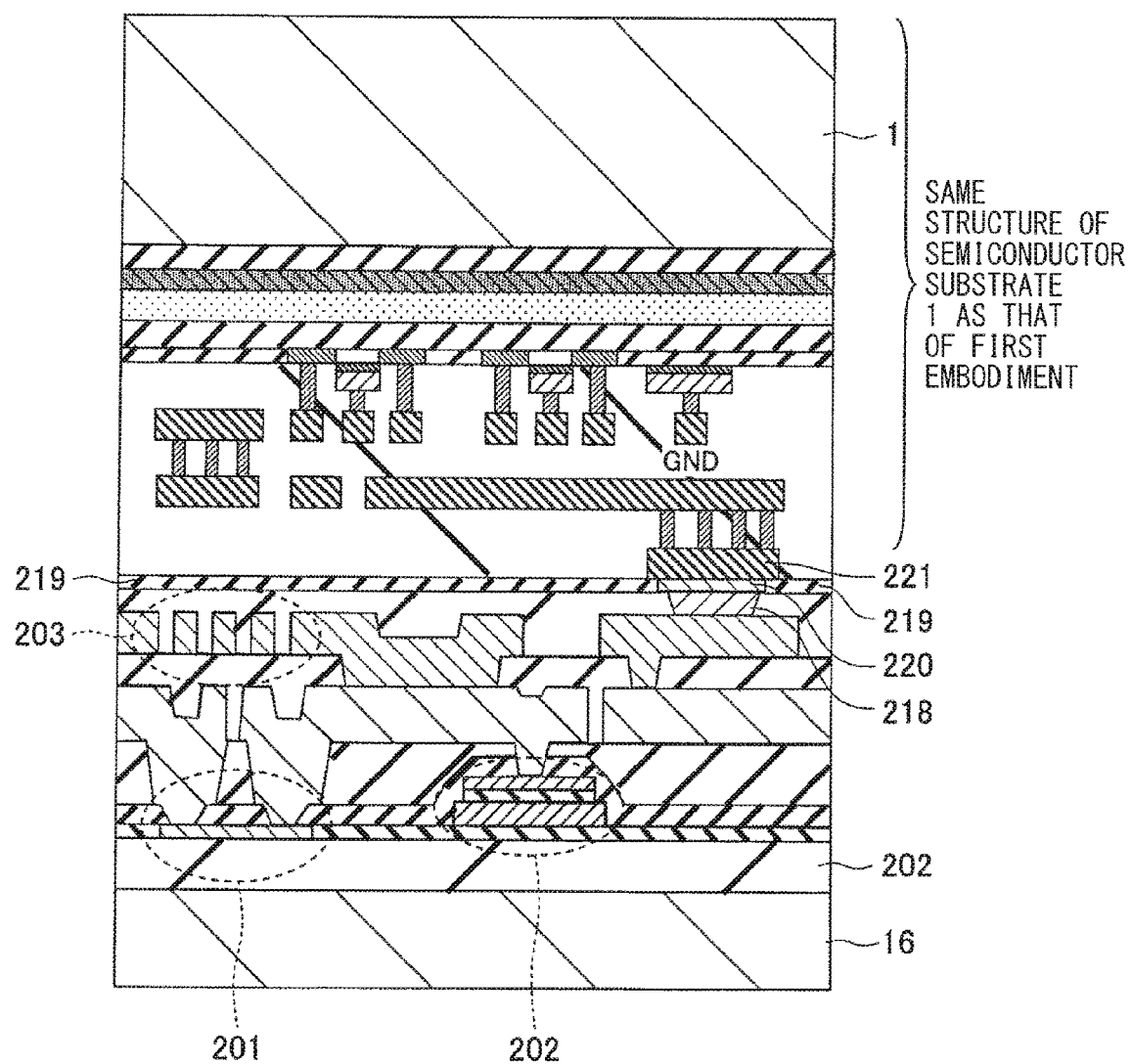
FIG. 21 is a cross-sectional view of a manufacturing process of the high-frequency semiconductor device according to the third embodiment.

The semiconductor substrate 1 in which the high-frequency transistor RFT and the like are formed in the foregoing first embodiment is adhered to the support substrate with the foregoing photosensitive bonding adhesive 219 and the electrically-conductive adhesive resin 220. It is to be noted that, in this embodiment, instead of the adhesive 23 of FIG. 1, the bonding adhesive 219 and the electrically-conductive adhesive resin 220 are used. The wiring layer 216 of the third layer is electrically connected to a wiring layer 221 as the third wiring layer on the semiconductor substrate 1 side through the bonding adhesive 219 and the electrically-conductive adhesive resin 220 (FIG. 21).

Figure 22:
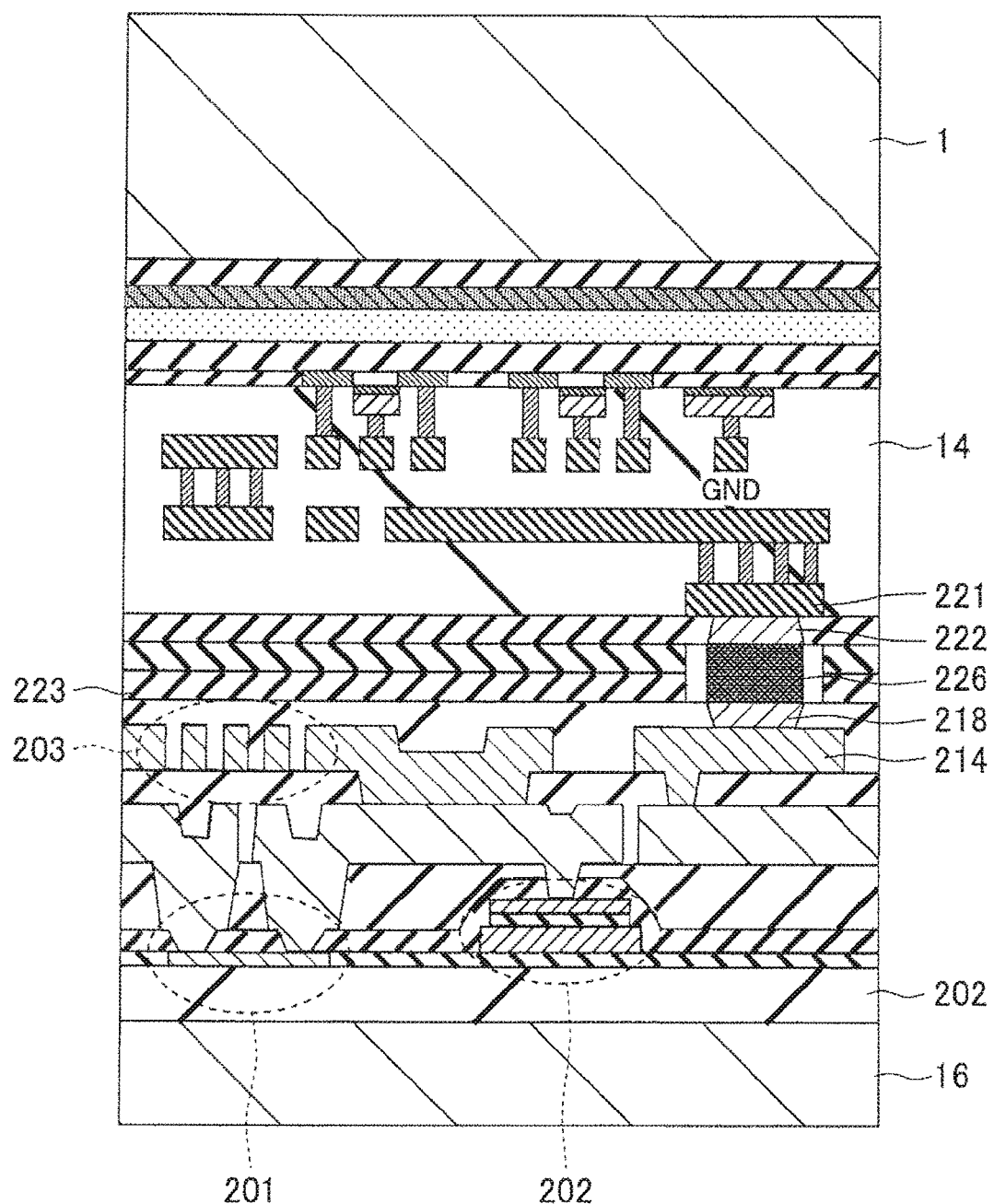
FIG. 22 is a cross-sectional view of a manufacturing process illustrating another joining method of the high-frequency semiconductor device according to the third embodiment.

Joining of the semiconductor substrate 1 and the support substrate 16 and connection between the connection electrode 218 and the wiring layer 221 may be in the form as illustrated in FIG. 22.

In this method, a micro joint 226 made of an alloy of Cu and Sn is formed on the connection electrode of the support substrate 16, a connection electrode 222 made of Cu is provided under the wiring layer 221 of the semiconductor substrate 1, and a micro joint 224 made of an alloy of Cu and Sn is further formed. Further, around the micro joint 226 and the micro joint 224, a resin made of BCB is arranged. Connection is made by a hybrid bond method.

Figure 23:
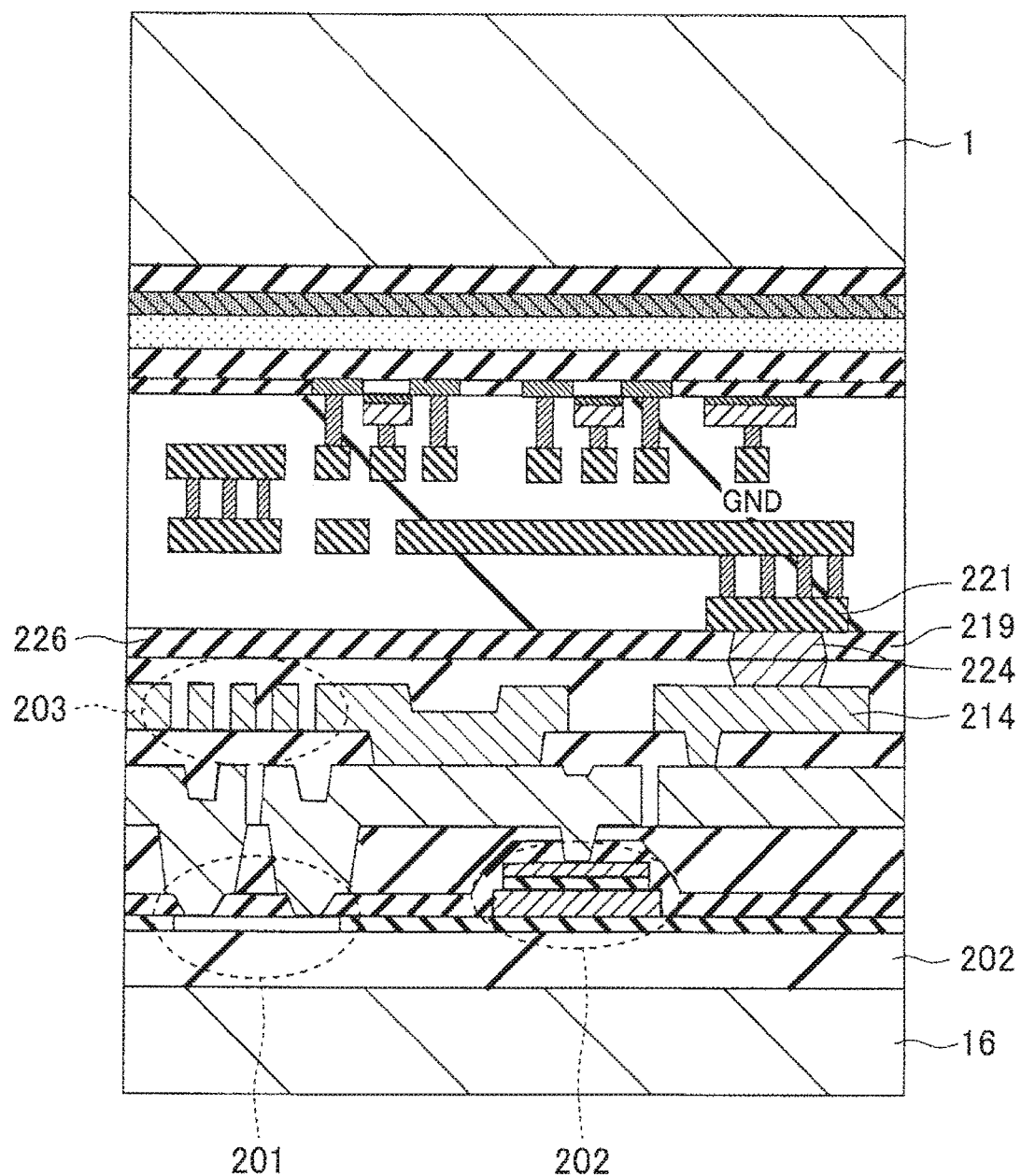
FIG. 23 is a cross-sectional view of a manufacturing process illustrating still another joining method of the high-frequency semiconductor device according to the third embodiment.

Further, another method is illustrated in FIG. 23.

The method illustrated in FIG. 23 is a method in which the connection electrode 222 made of Cu is provided under the wiring layer 221 of the semiconductor substrate 1, and such a connection electrode 222 is connected to the connection electrode 218 of the support substrate 16 by Cu—Cu bonding. Around the connection electrode 222 provided on the semiconductor substrate 1, an insulating film made of a silicon oxide film or the like is formed.

In any joining method, thereafter, as in the first embodiment, the semiconductor substrate 1 is thinned (see FIG. 4b), and the various via holes (Va and Vb) are formed (see FIGS. 5a to 9b). Thereafter, through formation of the connection film 20a and the thermal bonding film 20b (FIGS. 10a to 11b), the BGA terminal 22 illustrated in FIG. 16 is formed to complete the high-frequency semiconductor device.

In the third embodiment, the passive elements often having larger occupied areas compared to the FET are laminated on the support substrate 16 side, and thereby, the chip area is decreased.

Further, for example, heat generated in the FET (the high-frequency transistor RFT) in the semiconductor substrate 1 may be received by the second wiring layer and/or the like of the multilayer wiring structure, and may be conducted from the electrically conductive layers and the electrically conductive films (221, 220, and 218) having high heat conductivity into the multilayer wiring structure in the support substrate 16.

The line width of the multilayer wiring structure in the support substrate 16 is thick, since a plated layer having a high electrically-conductive layer thickness and the like are heavily used and such a multilayer wiring structure is a wiring layer of the passive elements. Therefore, conducted heat is easily absorbed therein, and the internal heat release effect thereof is high. Further, since characteristics of the passive elements are less likely to be changed compared to those of the FET, the heat resistivity thereof is high in that context. Further, the multilayer wiring structure in the support substrate 16 is also allowed to effectively serve as a heat medium that effectively conducts heat to the support substrate 16 side.

Therefore, since heat generated in the FET in the semiconductor substrate 1 is released through various heat release paths, lowered high-frequency characteristics resulting from heat is further less likely to occur than in the first embodiment. Further, in the case where the "dummy wiring section" of the second embodiment is combined with the heat release and the heat conduction structure on the support substrate side of this embodiment, heat release is allowed to be performed further effectively.

4. Forth Embodiment

Figure 24A:
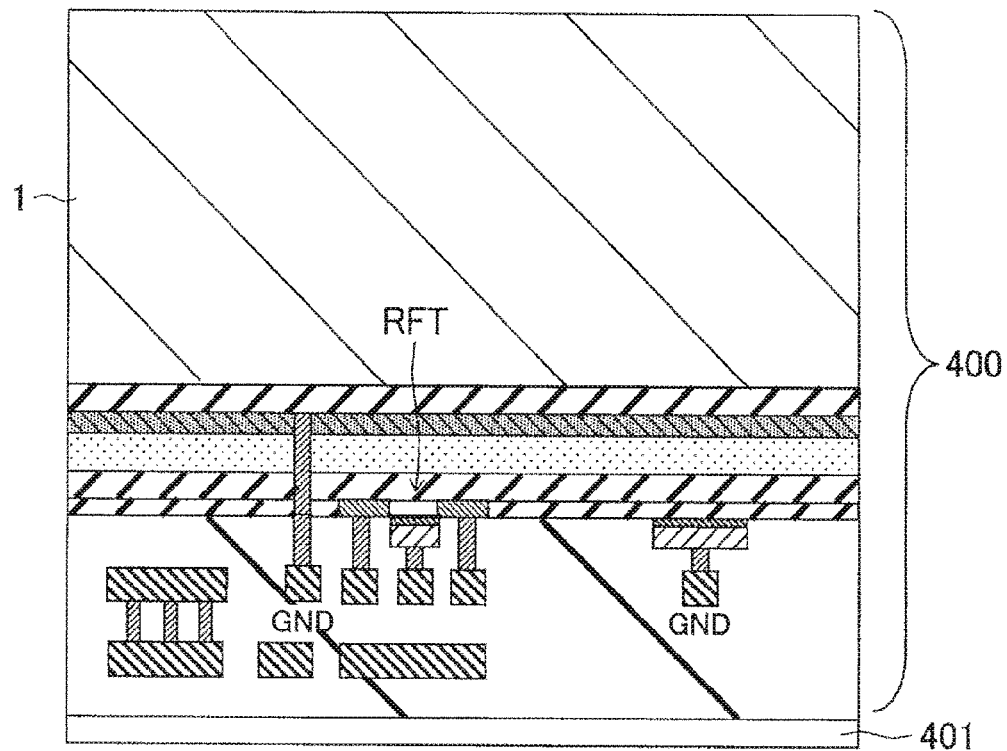
FIG. 24a is a schematic cross-sectional view of a main section of a high-frequency semiconductor device according to a fourth embodiment.
Figure 24B:
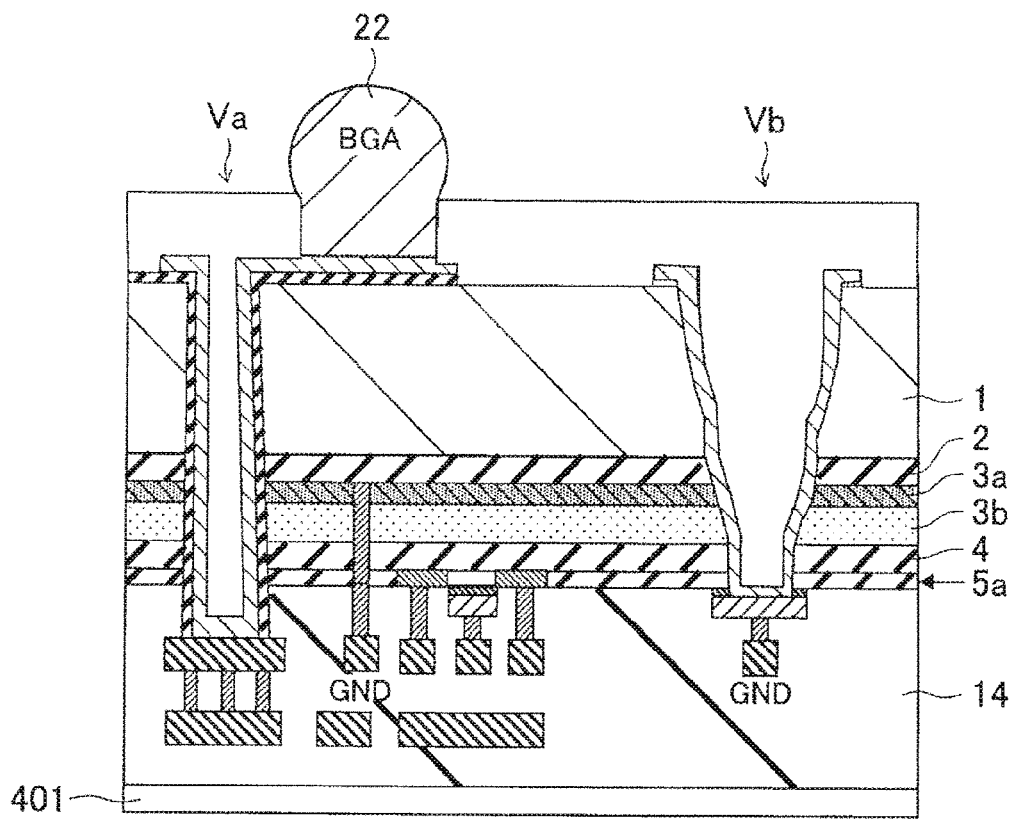
FIG. 24b is a schematic cross-sectional view of a main section of the high-frequency semiconductor device according to the fourth embodiment.

With regard to a high-frequency semiconductor device RFD4 according to a fourth embodiment, FIG. 24a illustrates a cross-sectional view in the middle of the manufacturing thereof, and FIG. 24b illustrates a cross-sectional view after completing the manufacturing.

FIG. 24a is a view at the time of a process corresponding to FIG. 4a according to the first embodiment.

In FIG. 4a, the semiconductor substrate 1 after formation of the device and the multilayer wiring layer is bonded to the support substrate 16 with the adhesive 23.

In FIG. 24a according to this embodiment, the semiconductor substrate 1 after formation of the device (the high-frequency transistor RFT) and the multilayer wiring layer is indicated by referential symbol 400. The substrate will be referred to as the semiconductor substrate 1 (400) below.

In the semiconductor substrate 1 (400) of this embodiment, instead of a substrate made of an inorganic material such as glass, a die attachment sheet 401 indicated by referential symbol 401 is attached to the uppermost surface of the multilayer wiring layer.

Thereafter, as in FIG. 4b, the semiconductor substrate 1 is thinned by cutting and grinding the rear surface of the semiconductor substrate 1. However, in this embodiment, in the final structure of FIG. 24b, the thin die attachment sheet 401 does not much serve as a support substrate securing whole rigidity. Therefore, the semiconductor substrate 1 may be desirably left thicker than in the first embodiment. Therefore, the aspect ratios of the formed connection via hole Va and the formed heat release via hole Vb are increased.

In the cross-sectional views of FIG. 1, FIG. 24b, and the like, the laminated film section of the SOI substrate in which the first insulating layer 2 and the second insulating layer 4 are arranged on both sides in the thickness direction of the epitaxial polysilicon layer (3a and 3b) is a characteristic section. Therefore, dimensions in the thickness direction of the laminated film section are illustrated emphatically (in an expanded manner) more than in the other sections. However, the thickness of the laminated film section is about several tens of micrometers as a whole. Further, the epitaxial polysilicon layer (3a and 3b) is arranged in proximity to the whole surface of the semiconductor layer 5a as a heat generation source with the thin second insulating layer 4 in between. Therefore, main heat release paths are still the paths indicated by the referential symbols Rt1 and Rt2 in FIG. 1.

In this embodiment, the semiconductor substrate 1 may be preferably thickened, since heat absorption ability of the semiconductor substrate 1 as a heat absorption member (a heatsink) is improved thereby.

In the first embodiment and the like, the semiconductor substrate 1 itself is allowed to be thickened. However, in the case where the semiconductor substrate 1 is used together with the thick support substrate 16 made of glass or the like, the semiconductor substrate 1 has to be thinned due to height limitation of the high-frequency semiconductor device.

Even in such a case, while the thickness of the SOI substrate (the whole substrate thickness including the respective layers 2 to 4 laminated on the semiconductor substrate 1) 1 may be, for example, from about 80 to about 90 μm both inclusive in the other embodiments, such a thickness is allowed to be increased to about 200 μm in this embodiment, resulting in an advantage that heat release efficiency is improved to that end.

5. Fifth Embodiment

The foregoing first embodiment is characterized in that the semiconductor substrate 1 is cut thin, and at least part thereof is left.

Figure 25:
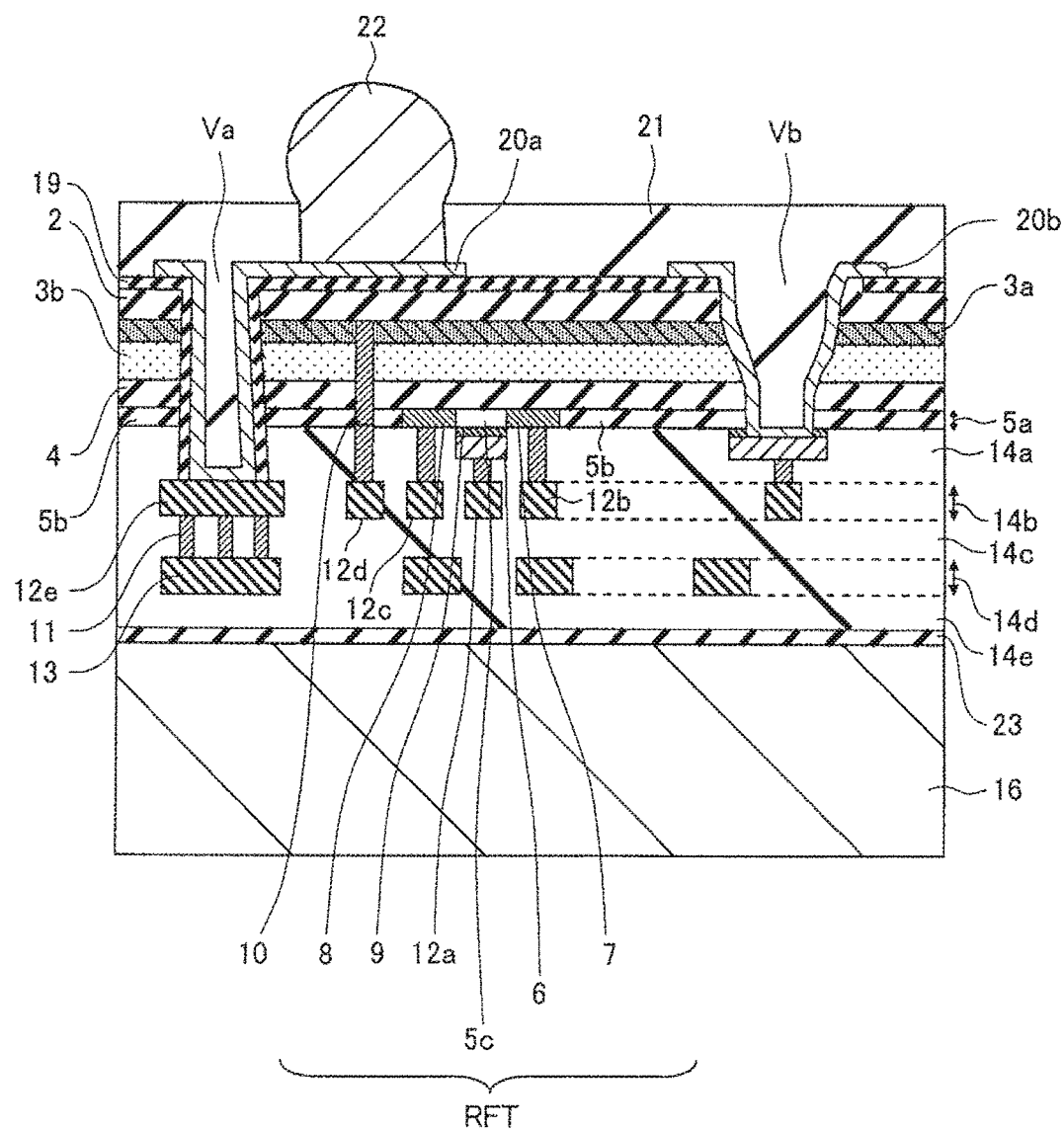
FIG. 25 is a schematic cross-sectional view of a main section of a high-frequency semiconductor device according to a fifth embodiment.

This embodiment demonstrates that in cutting the semiconductor substrate 1 thin, the semiconductor substrate 1 may be totally removed to the first insulating layer. FIG. 25 illustrates a cross section of a completed semiconductor device.

In this embodiment, in the case where the semiconductor device itself is mounted together with another semiconductor device, for example, with a silicon interposer in between, heat is released to the silicon interposer side though the ground terminal via the heat release via hole. Therefore, even if the semiconductor substrate 1 does not exist, a desired effect is achievable.

6. Consideration of Appropriate Ranges of Thicknesses of the Doped Epitaxial Polysilicon Layer 3a and the Second Insulating Layer 4

Figure 26:
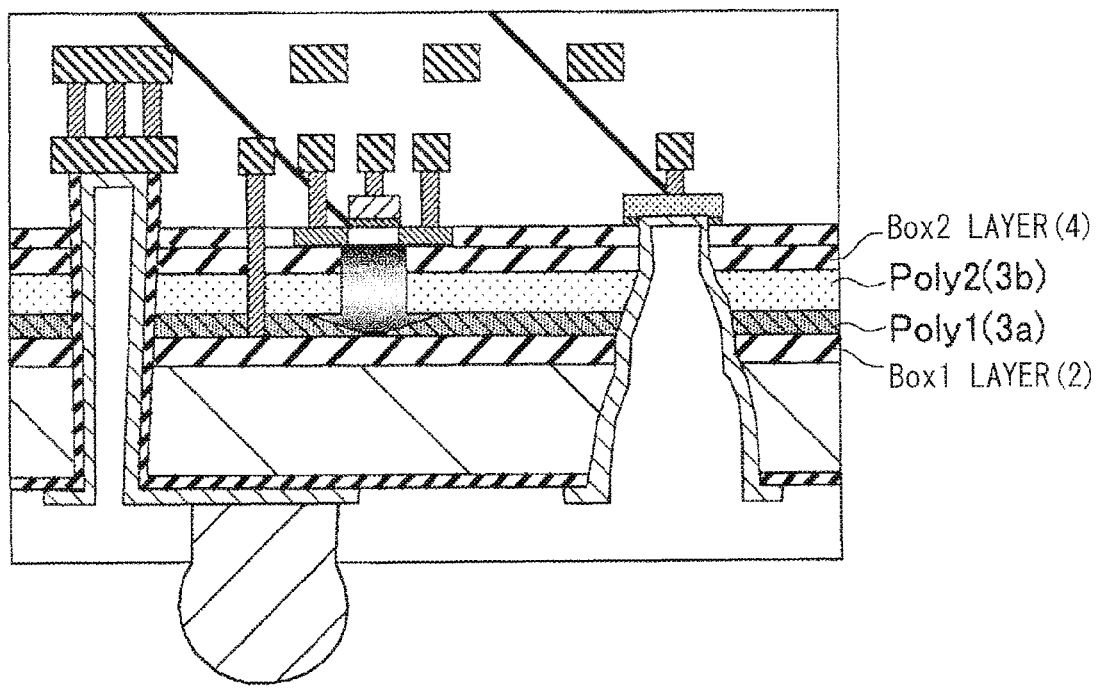
FIG. 26 is a view illustrating a device structure as a presupposition for consideration of film thicknesses.

FIG. 26 is a device structure as a presupposition for this consideration, and has a structure similar to that on the semiconductor substrate 1 side of FIG. 1. Details of the respective components are affixed with the same referential symbols as those of FIG. 1, and description thereof will be omitted.

Figure 27A:
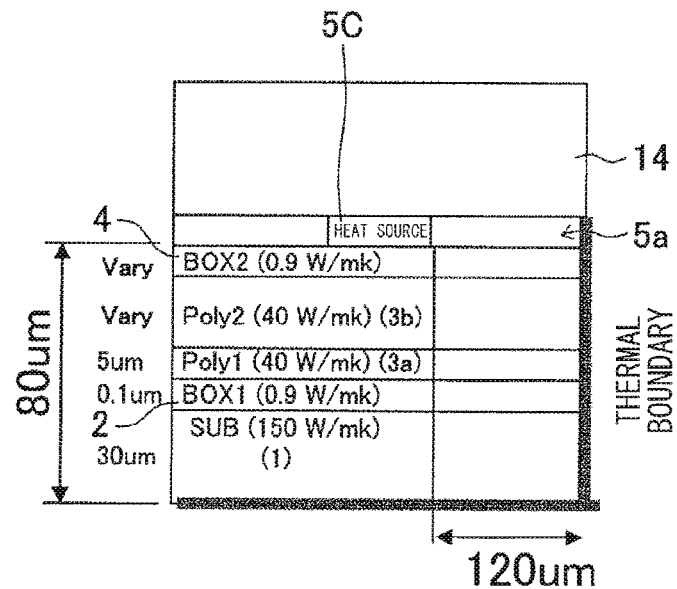
FIG. 27a is a diagram illustrating a result of the consideration of the film thicknesses.
Figure 27B:
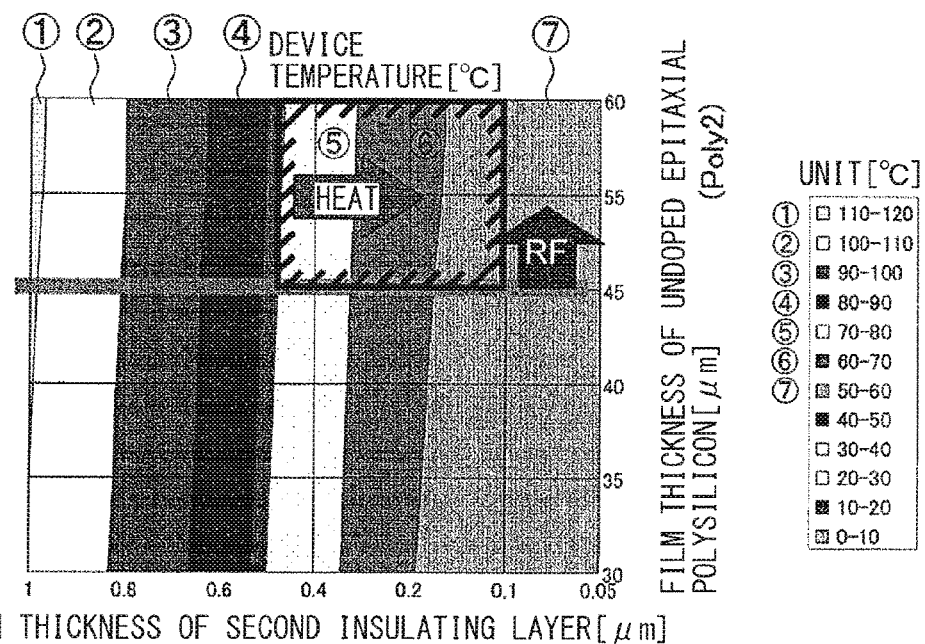
FIG. 27b is a diagram illustrating a result of the consideration of the film thicknesses.

FIG. 27b illustrates a simulation result at the time of the consideration. In FIG. 27b, the vertical axis indicates the film thickness of the undoped epitaxial polysilicon layer 3b (Poly2), and the horizontal axis indicates the film thickness of the second insulating layer 4 (Box2 layer). Regional sections of device temperature in the graph are indicated by circled numerical values.

FIG. 27a is a diagram illustrating conditions of the simulation.

Respective heat conductivities of the semiconductor substrate 1 (SUB) and the first and the second insulating layers 2 and 4 (BOX1 and BOX2) are 150 [W/m·K] and 0.9 [W/m·K]. Further, each of heat conductivities of the doped epitaxial polysilicon layer 3a and the undoped epitaxial polysilicon layer 3b is 40 [W/m·K].

The thickness of the semiconductor substrate 1 is 30 μm, the thickness of the first insulating layer 2 is 0.1 μm, and the thickness of the doped epitaxial polysilicon layer 3a is 5 μm.

Further, thermal boundary surfaces in a lateral direction and in a height direction of the device are a chip end surface separately placed by 120 μm from an end of the channel formation region 5c where a heat source exists and the rear surface of the semiconductor substrate 1 separately placed by 80 μm from the bottom surface of the channel formation region 5c.

The simulation result illustrated in FIG. 27b is obtained as follows. That is, under the conditions illustrated in FIG. 27a, the thickness of the undoped epitaxial polysilicon layer 3b and the thickness of the second insulating layer 4 are variously changed, and the device temperature distribution at each time is obtained by thermal analysis simulation.

Figure 28:
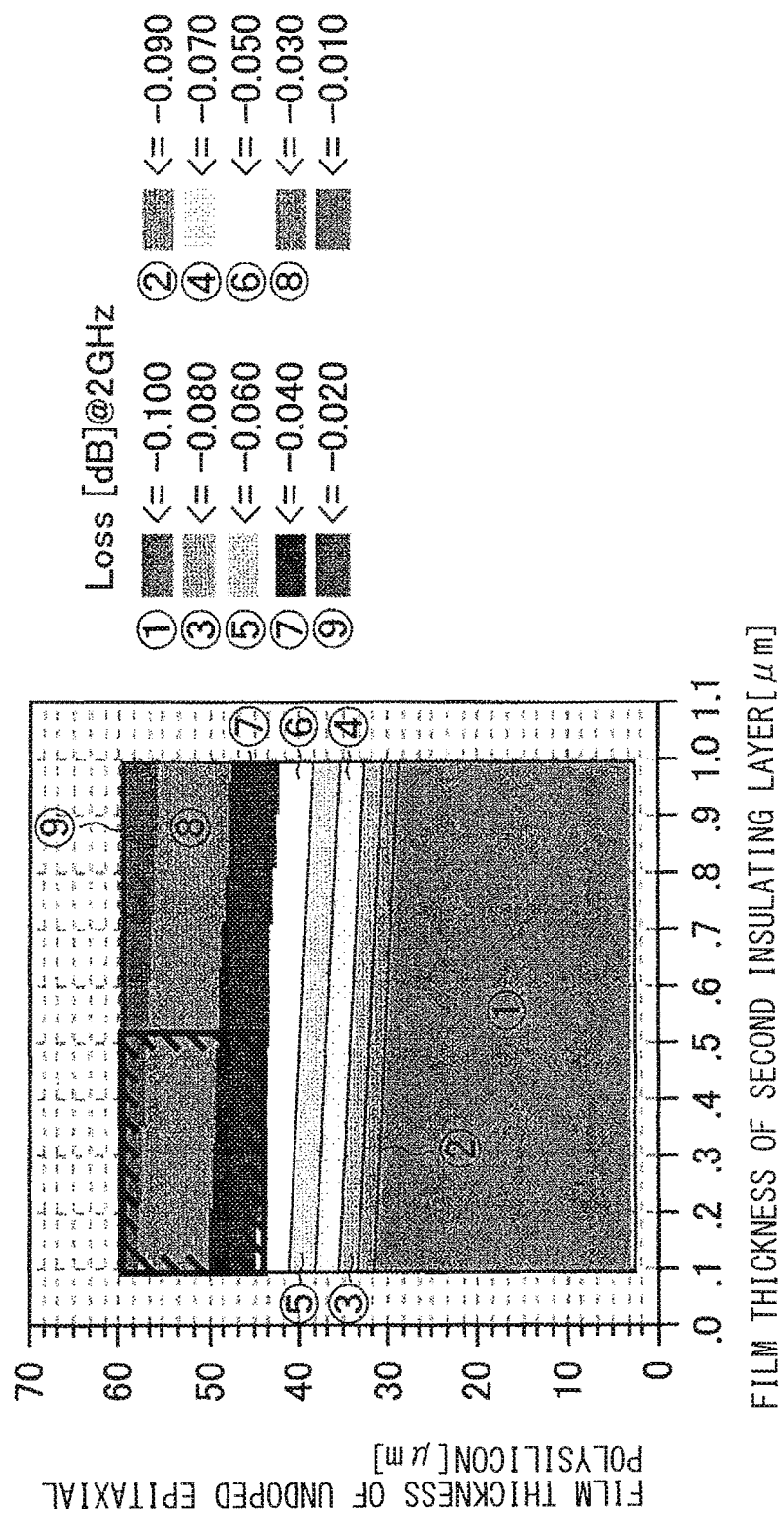
FIG. 28 is a diagram illustrating a result of the consideration of the film thicknesses.

FIG. 28 is a graph illustrating a result of a device simulation obtained by examining a relation between insertion loss of the device at high frequency of 2 GHz and each film thickness. Notation of the vertical axis and the horizontal axis of the graph is substantially same as that of FIG. 24b.

In a high-frequency transistor, one of the important performances other than harmonic distortion characteristics is insertion loss.

When the product of on-resistance and a parasitic capacitance of the high-frequency transistor are increased, the insertion loss is degraded (increased).

Therefore, it may be desirable that the thicknesses of the second insulating layer and the undoped epitaxial polysilicon layer are set in consideration of a capacity value determined by the thickness of the undoped epitaxial polysilicon layer and the thickness of the second insulating layer and heat release characteristics to be improved in the present disclosed technology.

In the result of the device simulation of FIG. 28, based on the fact that the insertion loss is ought to be equal to or less than −0.04 dB as a requisition to a high-frequency transistor, the lower limit (45 μm) of the thickness of the undoped epitaxial polysilicon layer 3b is determined. Further, in view of the fact that a temperature standard guide assumed based on the temperature simulation of FIG. 27b and measurement results is equal to or less than 80 deg C., the upper limit (0.5 μm) of the film thickness of the second insulating layer 4 is determined. The lower limit (0.1 μm) of the film thickness of the second insulating layer 4 is determined in view of parasitic capacitance magnitude, film formation characteristics, and insulation characteristics.

From the foregoing results, it is found that the thickness of the doped epitaxial polysilicon layer 3a may be desirably equal to or larger than 45 μm, and the film thickness of the second insulating layer 4 may be desirably from 0.1 μm to 0.5

μm both inclusive in view of favorable high-frequency characteristics and practical device temperature.

In the case where the respective film thicknesses are within the foregoing desirable ranges, a high-frequency switching device with high performance in which degraded electric characteristics resulting from self-heating does not occur, and high-frequency distortion characteristics are allowed to be improved due to carrier trap effect in the epitaxial polysilicon layer is achievable.

Figure 29:
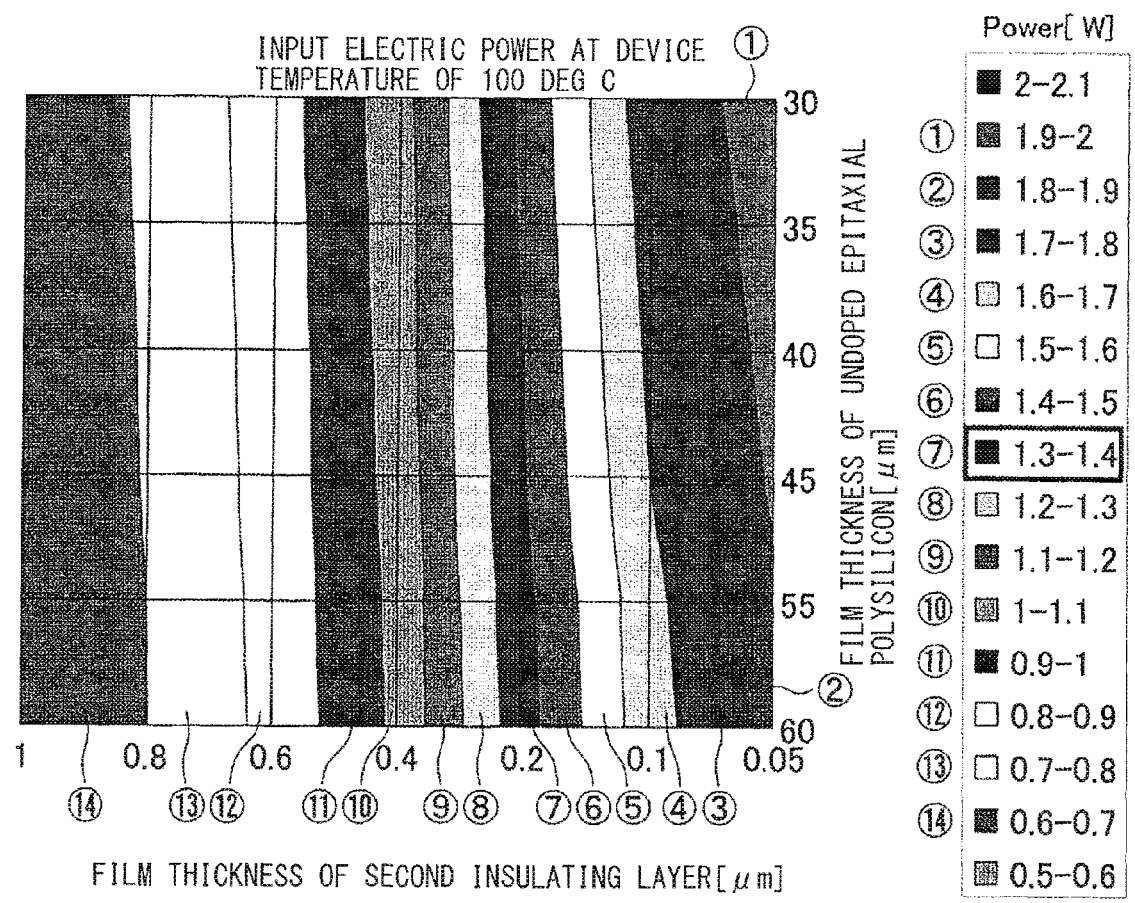
FIG. 29 is a diagram illustrating a result of the consideration of the film thicknesses.

FIG. 29 is a diagram illustrating a result of estimating how much an input signal is allowed to be increased on the assumption that self-heating occurs at the nearly equal degree to that before applying the present disclosed technology (a general SOI substrate).

From the result, after applying the present disclosed technology, 0.7 W of the input signal before applying the present disclosed technology is allowed to be increased to 1.3 to 1.4 W both inclusive, and power handling that is about twice as large as in a related technology is achievable.

7. Application Example

Figure 30A:
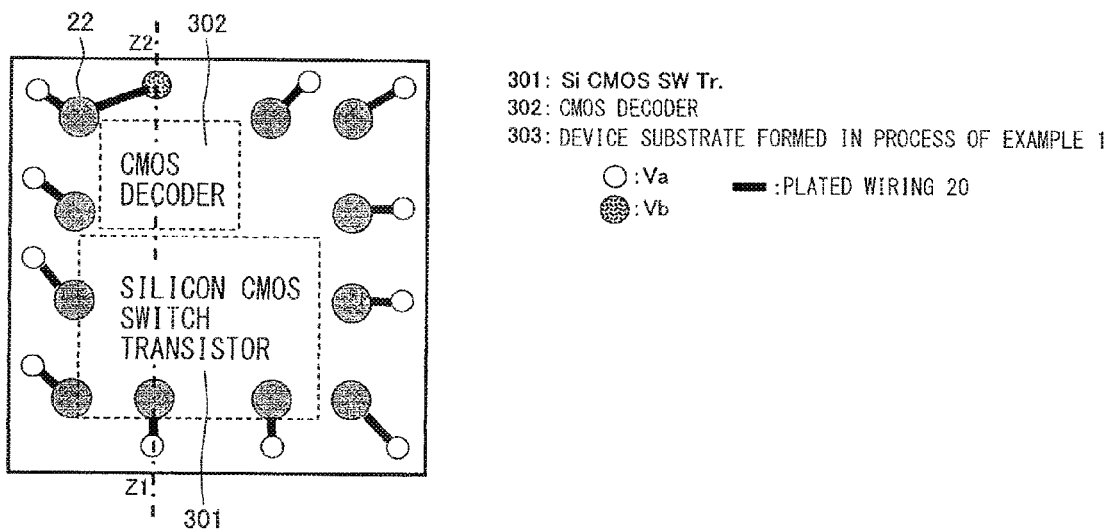
FIG. 30a is a diagram illustrating a plain surface of an application example of the present disclosed technology.
Figure 30B:
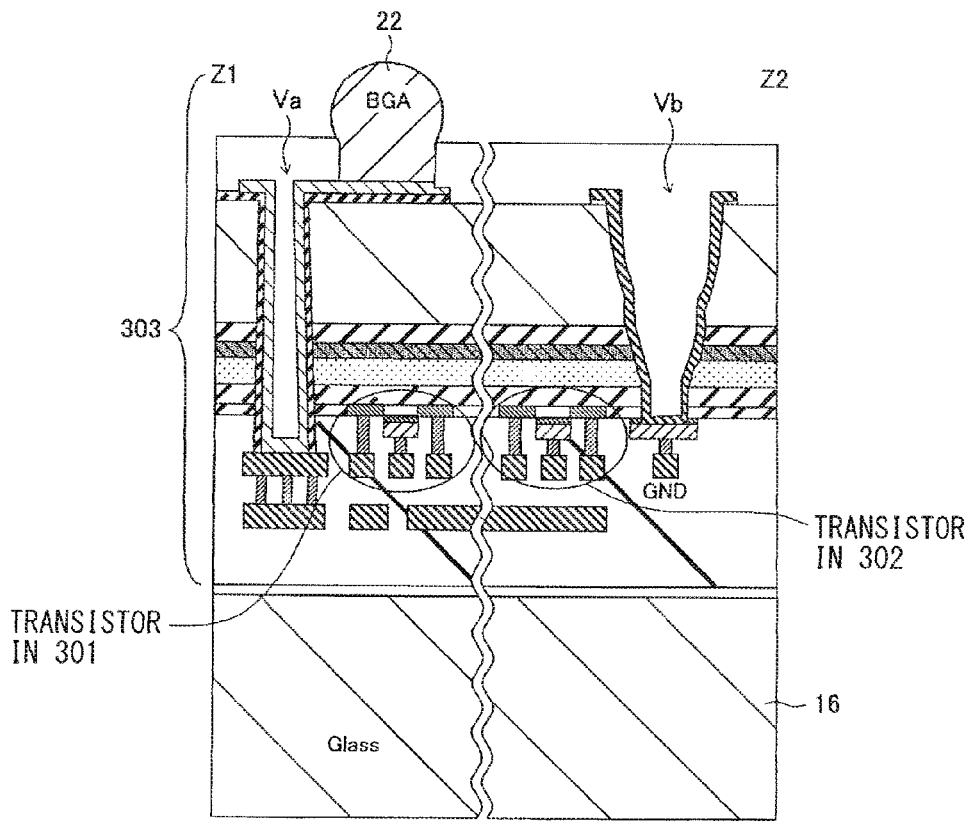
FIG. 30b is a view illustrating a cross section of the application example of the present disclosed technology.

For a high-frequency semiconductor device RFD5 according to this application example, FIG. 30a and FIG. 30b illustrate a whole configuration diagram (FIG. 30a) seen from the surface on which external terminals are arranged and a cross-sectional view (FIG. 30b) of a main section thereof. FIG. 30b is a cross-sectional view taken along z1-z2 of FIG. 30a. It is to be noted that in FIG. 30b, components having the same configurations as those of FIG. 1 are affixed with the same referential symbols, and description thereof will be omitted here.

In the high-frequency semiconductor device RFD5 illustrated in FIG. 30a and FIG. 30b, a silicon CMOS switch transistor section 301 and a CMOS decoder 302 generating a voltage as a peripheral circuit thereof are integrated on the same SOI substrate.

Of the foregoing, an N-type FET (the FET on the left side of FIG. 30b) in the silicon CMOS switch transistor section 301 corresponds to a high-frequency transistor RFT to which a high-frequency signal in GHz band is applied whose high-frequency characteristics are improved by the substrate structure illustrated in FIG. 1. It is to be noted that an unillustrated P-type FET is also formed on the semiconductor layer 5a formed on the same semiconductor substrate 1. An impurity having electrical conductivity type opposite of that of the N-type FET is introduced to the channel formation region 5c and the two source-drain regions 7 and 8.

Further, the FET on the right side of FIG. 30b corresponds to an FET in the CMOS decoder 302.

In FIG. 30a and FIG. 30b, an application example is shown with the structure of FIG. 1 illustrating the first embodiment as an example. Further, the characteristic configurations of the second to the fifth embodiments may be applicable.

In the case where many functions are integrated on one chip, it is important to decrease the chip area including passive elements such as a resistor, a capacitor, and an inductor. In that context, in particular, as in the third embodiment, it is effective to form these passive elements in the multilayer wiring structure on the support substrate side.

Peripheral circuits respond to low frequency and have silicon CMOS configurations. Therefore, the peripheral circuits have been formed on a silicon chip differently from a compound semiconductor chip in related technologies.

The present disclosed technology described in the foregoing first to the foregoing fifth embodiments improves characteristics of a high-frequency circuit in integrating a high-frequency circuit and peripheral circuits with different frequencies on a silicon SOI substrate. Therefore, by applying the present disclosed technology, a one-chip structure of a high-functional semiconductor device may be easily achieved, for example, as described in the application example illustrated in FIG. 30a and FIG. 30b. In that context, the present disclosed technology is applicable not only to functions such as an "antenna switch" and a "CMOS decoder," but also to high-frequency semiconductor devices widely.

The present disclosure contains subject matter related to that disclosed in Japanese Priority Patent Application JP 2012-025422 filed in the Japan Patent Office on Feb. 8, 2012, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

The invention claimed is:

1. A high-frequency semiconductor device, comprising:
a first insulating layer;
an undoped epitaxial polysilicon layer in a state of column crystal, wherein the state of column crystal is obtained at a temperature of equal to or higher than 1000 deg C.;
a second insulating layer;
a semiconductor layer; and
a high-frequency transistor,
wherein the first insulating layer, the undoped epitaxial polysilicon layer, the second insulating layer, and the semiconductor layer are formed on one surface of a semiconductor substrate in order from the one surface, and
the high-frequency transistor is formed in a location of the semiconductor layer facing the undoped epitaxial polysilicon layer with the second insulating layer in between.

2. The high-frequency semiconductor device according to claim 1, further comprising:
a doped epitaxial polysilicon layer formed between the first insulating layer and the undoped epitaxial polysilicon layer in the state of column crystal, the doped epitaxial polysilicon layer being interposed between the semiconductor substrate and the high-frequency transistor, and having a resistance lowered by doping with an impurity; and
a connection structure that connects the doped epitaxial polysilicon layer to a ground electric potential.

3. The high-frequency semiconductor device according to claim 2, further comprising a first interlayer insulating film and a first wiring layer including a ground electrode layer that are laminated on a side opposite to the second insulating layer with respect to the semiconductor layer,
wherein the ground electrode layer is electrically connected to the doped epitaxial polysilicon layer through a contact plug.

4. The high-frequency semiconductor device according to claim 1, further comprising a thermal bonding member,
wherein a heat release hole is formed, the heat release hole starting from the semiconductor substrate, passing through the first insulating layer and the doped epitaxial polysilicon layer to reach the undoped epitaxial polysilicon layer, and
the thermal bonding member is formed on an internal wall of the heat release hole, and has a higher thermal conductivity than a thermal conductivity of the first insulating layer.

5. The high-frequency semiconductor device according to claim 1, further comprising a dummy wiring section for heat transfer to release heat generated in the high-frequency transistor through a multilayer wiring layer of the semiconductor substrate, the dummy wiring section being formed with the use of a second wiring layer on a first wiring layer in the multilayer wiring layer, and the dummy wiring section not connecting to an other electrically-conductive member used as a wiring of a circuit or an element.

6. The high-frequency semiconductor device according to claim 1, further comprising:
an insulating support substrate bonded to a surface of the semiconductor substrate on which a multilayer wiring layer is formed; and
a passive element formed on the support substrate.

7. The high-frequency semiconductor device according to claim 1, wherein the high-frequency transistor is an antenna switch element.

8. The high-frequency semiconductor device according to claim 1, wherein a thickness of the undoped epitaxial polysilicon layer in the state of column crystal is equal to or larger than 45 µm, and a thickness of the second insulating layer is from 0.1 µm to 0.5 µm both inclusive.

9. A method of manufacturing a high-frequency semiconductor device, the method comprising:
laminating a first insulating layer, a doped epitaxial polysilicon layer having a resistance lowered by doping with an impurity, an undoped epitaxial polysilicon layer in a state of column crystal, a second insulating layer, and a semiconductor layer in this order on a semiconductor substrate;
forming a high-frequency transistor including a channel region in the semiconductor layer;
forming an electrode layer in a first multilayer wiring layer of the semiconductor substrate, the electrode layer being connected to the high-frequency transistor with a contact plug in between; and
forming a ground connection structure that connects the doped epitaxial polysilicon layer to a ground electric potential; wherein out of the doped epitaxial polysilicon layer and the undoped epitaxial polysilicon layer in the state of column crystal, at least the undoped epitaxial polysilicon layer in the state of column crystal is formed at a temperature equal to or higher than 1000 deg C with the use of an epitaxial growth technology.

10. The method according to claim 9, wherein, in forming the ground connection structure of the ground electric potential,
a first contact plug is formed, the first contact plug starting from a region other than the channel region to reach the doped epitaxial polysilicon layer, and
upon forming the contact plug and the electrode layer with respect to the high-frequency transistor, a second contact plug and a ground electrode layer are formed, the second contact plug being connected to the first contact plug, and the ground electrode layer being connected to the second contact plug.

11. The method according to claim 9, wherein
the semiconductor substrate is bonded to a support substrate from a side of a surface on which the multilayer wiring layer is formed,
the semiconductor substrate is thinned from a rear surface of the semiconductor substrate after the bonding to the support substrate,
a heat release hole is formed, the heat release hole starting from a rear surface of the thinned semiconductor substrate to reach the doped epitaxial polysilicon layer, and
a thermal bonding member is formed on a side wall in the formed heat release hole, the thermal bonding member having a higher thermal conductivity then a thermal conductivity of the first insulating layer, and the thermal bonding member being in contact with the doped epitaxial polysilicon layer, the undoped epitaxial polysilicon layer in the state of column crystal, and the semiconductor substrate.

12. The method according to claim 11, wherein
the heat release hole is formed so that a side wall is in a forward tapered shape,
a connection hole for leading out a wiring to an external terminal side is formed from the rear surface of the thinned semiconductor substrate to the multilayer wiring layer so that a side wall is in a reverse tapered shape,
an insulating film is formed on internal side walls of the heat release hole and the connection hole, and anisotropic etching is performed so that the insulating film is removed from the side wall of the heat release hole in the forward tapered shape and is left on the side wall of the connection hole in the reverse tapered shape, and
an electrically-conductive film and a connection film are concurrently formed, the electrically-conductive film being as the thermal bonding member provided on the side wall of the heat release hole after removing the insulating film, and the connection film passing from an internal bottom surface of the connection hole and the insulating film left on the side wall of the connection hole in the reverse tapered shape to reach the rear surface of the semiconductor substrate.

13. The method according to claim 9, wherein in the multilayer wiring layer, a dummy wiring section is formed for heat transfer to release heat generated in the high-frequency transistor through the multilayer wiring layer, the dummy wiring section not connecting to an other electrically-conductive member used as a wiring of a circuit or an element.

14. The method according to claim 9, wherein
the high-frequency transistor and the multilayer wiring layer are formed on the semiconductor substrate,
a second multilayer wiring layer including a passive element is formed on a support substrate, and
the semiconductor substrate and the support substrate are bonded so that the first multilayer wiring layer of the semiconductor substrate and the second multilayer wiring layer of the support substrate are electrically connected to each other.

15. The method according to claim 9, wherein the high-frequency transistor is an antenna element.

16. The method according to claim 9, wherein
the undoped epitaxial polysilicon layer in the state of column crystal is epitaxially grown so that a thickness of the undoped epitaxial polysilicon layer in the state of column crystal is equal to or larger than 45 µm, and
the second insulating layer is formed so that a thickness of the second insulating layer is from 0.1 µm to 0.5 µm both inclusive.

* * * * *